(12) United States Patent
Wu et al.

(10) Patent No.: US 11,164,799 B2
(45) Date of Patent: Nov. 2, 2021

(54) STACKED VERTICAL TRANSPORT FIELD EFFECT TRANSISTOR CONTACT FORMATION

(71) Applicant: INTERNATIONAL BUSINESS MACHINES CORPORATION, Armonk, NY (US)

(72) Inventors: Heng Wu, Guilderland, NY (US); Chen Zhang, Albany, NY (US); Kangguo Cheng, Schenectady, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/453,040

(22) Filed: Jun. 26, 2019

(65) Prior Publication Data
US 2020/0411388 A1    Dec. 31, 2020

(51) Int. Cl.
| H01L 21/84 | (2006.01) |
| H01L 21/768 | (2006.01) |
| H01L 27/12 | (2006.01) |
| H01L 29/78 | (2006.01) |
| H01L 21/8234 | (2006.01) |
| H01L 21/8238 | (2006.01) |

(52) U.S. Cl.
CPC ........ *H01L 21/84* (2013.01); *H01L 21/76805* (2013.01); *H01L 21/823487* (2013.01); *H01L 21/823885* (2013.01); *H01L 27/1207* (2013.01); *H01L 29/7827* (2013.01)

(58) Field of Classification Search
CPC ..... H01L 21/823885; H01L 21/823487; H01L 29/7827
See application file for complete search history.

(56) References Cited

U.S. PATENT DOCUMENTS

| 9,659,963 | B2 | 5/2017 | Cheng et al. |
| 9,680,473 | B1 | 6/2017 | Anderson et al. |
| 9,761,712 | B1 | 9/2017 | Anderson et al. |
| 9,824,933 | B1 | 11/2017 | Pawlak |
| 9,899,515 | B1 | 2/2018 | Cheng et al. |
| 9,997,413 | B1* | 6/2018 | Leobandung ... H01L 21/823871 |
| 10,297,513 | B1* | 5/2019 | Yamashita .......... H01L 29/6656 |
| 2006/0261406 | A1 | 11/2006 | Chen |
| 2012/0135573 | A1 | 5/2012 | Kim |

(Continued)

*Primary Examiner* — Selim U Ahmed
*Assistant Examiner* — Evan G Clinton
(74) *Attorney, Agent, or Firm* — L. Jeffrey Kelly

(57) ABSTRACT

A method for forming a semiconductor structure is provided. The method including epitaxially growing a first source drain on the semiconductor structure between a first lower fin in a first region of the semiconductor structure and a second lower fin in a second region of the semiconductor structure, forming a first spacer layer on the first source drain, where a lower horizontal surface of the first spacer layer is coplanar with an upper horizontal surface of the first source drain, forming a lower gate stack surrounding the first lower fin and surrounding the second lower fin on exposed surfaces of the semiconductor structure, where a lower horizontal surface of the gate stack is coplanar with an upper horizontal surface of the first spacer layer, forming an interlayer dielectric on exposed surfaces of the first spacer layer.

19 Claims, 21 Drawing Sheets

(56) References Cited

U.S. PATENT DOCUMENTS

| | | |
|---|---|---|
| 2012/0208364 A1 | 8/2012 | Rouh et al. |
| 2017/0025412 A1 | 1/2017 | Jun et al. |
| 2018/0122792 A1 | 5/2018 | Anderson et al. |
| 2019/0088767 A1* | 3/2019 | Xie .................... H01L 29/7827 |

* cited by examiner

STACKED VERTICAL TRANSPORT FIELD EFFECT TRANSISTOR CONTACT FORMATION

BACKGROUND

The present invention relates, generally, to the field of semiconductor manufacturing, and more particularly to fabricating field effect transistors.

Complementary Metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. A vertical transport FET or vertical FET is a structure in which current flow is in the vertical direction flowing between a source/drain at a top of a fin and a second source/drain adjacent to a bottom of the fin, and a wrap-around gate surrounding a middle portion of the fin.

As demands to reduce the dimensions of transistor devices continue, vertical-type transistors such as vertical field effect transistors (vertical FETs or VFETs) help achieve a reduced FET device footprint while maintaining FET device performance. A vertical FET may use less surface area of a die than conventional FETs, which is needed with shrinking design rules.

Shrinking topology of VFETs pose challenges to form contacts to the source and to the drain of the VFET.

SUMMARY

According to an embodiment, a method for forming a semiconductor structure is provided. The method including epitaxially growing a first source drain on the semiconductor structure between a first lower fin in a first region of the semiconductor structure and a second lower fin in a second region of the semiconductor structure, forming a first spacer layer on the first source drain, where a lower horizontal surface of the first spacer layer is coplanar with an upper horizontal surface of the first source drain, forming a lower gate stack surrounding the first lower fin and surrounding the second lower fin on exposed surfaces of the semiconductor structure, where a lower horizontal surface of the gate stack is coplanar with an upper horizontal surface of the first spacer layer, forming an interlayer dielectric on exposed surfaces of the first spacer layer, where a lower horizontal surface of the interlayer dielectric is coplanar with the lower horizonal surface of the gate stack and a lower horizontal surface of the interlayer dielectric is coplanar with an upper horizontal surface of the gate stack, where the interlayer dielectric separates the lower gate stack surrounding the first lower fin and the lower gate stack surrounding the second lower fin, forming a second spacer layer on exposed surfaces of the semiconductor structure, where a lower horizontal surface of the second spacer layer is coplanar with the upper horizontal surface of the gate stack, epitaxially growing a second source drain on the semiconductor, where a lower horizontal surface of the second source drain is coplanar with an upper horizontal surface of the second spacer, forming a first opening in the second source drain, where a portion of the second spacer layer is exposed, forming a dielectric layer on exposed surfaces of the semiconductor structure, where the dielectric layer fills the first opening and separates the second source drain region surrounding of the first lower fin and the second source drain surrounding the second lower fin, and forming a second opening by removing the second lower fin, a portion of the first spacer layer surrounding the second lower fin, a portion of the first source drain surrounding the second fin, a portion of the interlayer dielectric surrounding the second lower fin, a portion of the second spacer layer surrounding the second lower fin, a portion of the second source drain region surrounding the second lower fin, a portion of the dielectric layer surrounding the second lower fin, where a lower horizontal surface of the second opening is coplanar with a remaining portion of the first source drain surrounding the second lower fin.

According to an embodiment, a semiconductor structure is provided. The semiconductor structure including a first lower fin of a first stacked fin separated by an oxide layer from a first upper fin of the first stacked fin, both in a first region on a semiconductor substrate, where the first lower fin and the first upper fin are vertically aligned, a second lower fin of a second stacked fin in a second region on the semiconductor substrate, a first source drain region between the first lower fin and the second lower fin, a first spacer layer directly above the first source drain and between the first lower fin and the second lower fin, a lower gate stack directly above the first spacer layer and between the first lower fin and the second lower fin, a second spacer layer directly above the lower gate stack and between the first lower fin and the second lower fin, a first lower fin second source drain region and a second lower fin second source drain region directly above the second spacer layer, a dielectric layer directly above the second spacer layer and between the first lower fin second source drain region and the second lower fin second source drain region; and an opening, where a horizontal lower surface of the opening is coplanar with a horizontal upper surface of the first source drain.

According to an embodiment, a semiconductor structure is provided. The semiconductor structure including a first lower fin of a first stacked fin separated by an oxide layer from a first upper fin of the first stacked fin, both in a first region on a semiconductor substrate, where the first lower fin and the first upper fin are vertically aligned, a second lower fin of a second stacked fin on the semiconductor substrate, both in a second region on the semiconductor substrate, a first source drain region between the first lower fin and the second lower fin, a shallow trench isolation region separating the first source drain region of the first lower fin and the first source drain region of the second lower fin, a first spacer layer directly above the shallow trench isolation region and directly above the first source drain region of the first lower fin and directly above the first source drain region of the second lower fin, a lower gate stack directly above the first spacer layer and between the first lower fin and the second lower fin, a second spacer layer directly above the lower gate stack and between the first lower fin and the second lower fin, a first lower fin second source drain region directly above the second spacer layer and continuous between the first lower fin and the second lower fin, a dielectric layer directly above the second spacer layer and between the first lower fin second source drain region and the second lower fin second source drain region, and an opening, where a horizontal lower surface of the opening is coplanar with a horizontal upper surface of the second source drain.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

Figure 1:
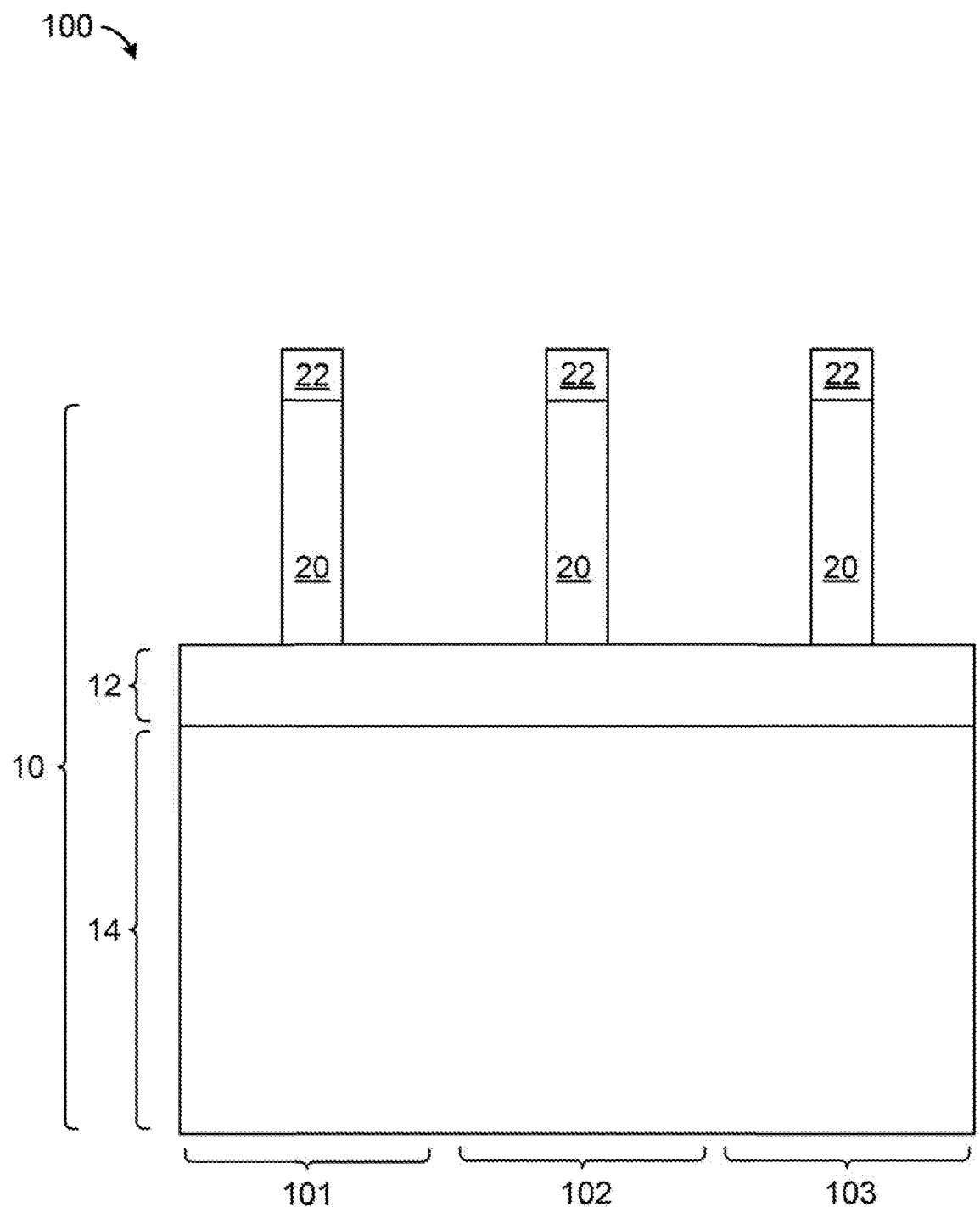
FIG. 1 illustrates a cross-sectional view of a semiconductor structure at an intermediate stage of fabrication, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor manufacturing and more particularly to fabricating contact to source and drain regions of both an upper field effect transistor (hereinafter "FET) and in a lower FET, in a double vertical stacked FET. The double vertical stacked FET may include a fin stack which includes a positive channel vertical field effect transistor (hereinafter "PFET") aligned with and stacked above a negative channel vertical field effect transistor (hereinafter "NFET"). Electrical contact to a source and to a drain of each the PFET and the NFET is required and may be formed by etching out a portion of an adjacent PFET and NFET double vertical stacked FET, and using merged and unmerged source/drain regions between double stacked FETs.

A method of forming a contact to a source and to a drain of each FET in a double stacked vertical FET is described in detail below by referring to the accompanying drawings in FIGS. 1-21, in accordance with an illustrative embodiment.

Referring now to FIG. 1, a semiconductor structure 100 (hereinafter "structure") is shown according to an exemplary embodiment. The structure 100 of FIG. 1 may be formed or provided. The structure 100 may include a substrate 10. The substrate 10 may include a silicon layer 14 and an oxide layer 12 above the silicon layer 14. An upper fin 20 may be formed from the substrate 10 above the oxide layer 12. There may be a hard mask 22 covering an upper surface of the upper fin 20. The oxide layer 12 may be between 10 nm and 20 nm, although depths less than 10 nm and greater than 20 nm may be acceptable. In an embodiment, the upper fin 20 may have a horizontal width, between 8 nm-15 nm, a height of 80 nm-100 nm, and a pitch of 36 nm-54 nm between adjacent fins. The material of the oxide layer 12 may include any dielectric material such as silicon oxide, silicon oxynitride, silicon nitride, SiBCN, SiOC, low-k dielectric or any combination of these materials. The upper fin 20 may have a length of 40 nm-65 nm. In an embodiment, the hard mask 22 may be about 30 nm-70 nm high above the surface of the upper fin 20, although depths less than 30 nm and greater than 70 nm may be acceptable.

The substrate 10 may include a fin stack region 101, a fin stack region 102, and a fin stack region 103. As shown in FIG. 1, there are is one upper fin 20 in each of the fin stack regions 101, 102, 103. Additional structures, (not shown), may be formed on the substrate 10.

At this step of the manufacturing process, the beginning structure of a field effect transistor (hereinafter "FET") is shown. The FET may be formed on the substrate 10 according to techniques known in the art.

In general, a FinFET device may include a plurality of fins formed in the substrate 10. In this example, the FinFET may be formed from the substrate 10 using known photolithography and etch processes. It should also be noted, that in the context of FinFET devices the portion of the substrate 10 illustrated in the figures represents a cross-section view perpendicular with a length of the upper fins 20.

A FinFET device may include a plurality of fins formed in a substrate and a wrap-around gate covering a portion of each of the fins. The portion of each of the fins covered by the gate may serve as a channel region of the device. A top source drain region of the device may be located adjacent to an upper portion of the fin and a bottom source drain region may be located adjacent to a lower portion of the fin.

The substrate 10 may be, for example, a layered semiconductor such as Si/SiGe, a silicon-on-insulator, or a SiGe-on-insulator, where a buried insulator layer separates a base substrate from a top semiconductor layer. In such cases, components of the structure 100 may be formed in or from the top semiconductor layer of the SOI substrate. In other embodiments, the substrate 10 may be a bulk substrate, which may be made from any of several known semiconductor materials such as, for example, silicon, germanium, silicon-germanium alloy carbon-doped silicon-germanium alloy, and compound (e.g. III-V and II-VI) semiconductor materials. Non-limiting examples of compound semiconductor materials include gallium arsenide, indium arsenide, and indium phosphide. Typically the substrate 10 may be approximately, but is not limited to, several hundred microns thick.

Figure 2:
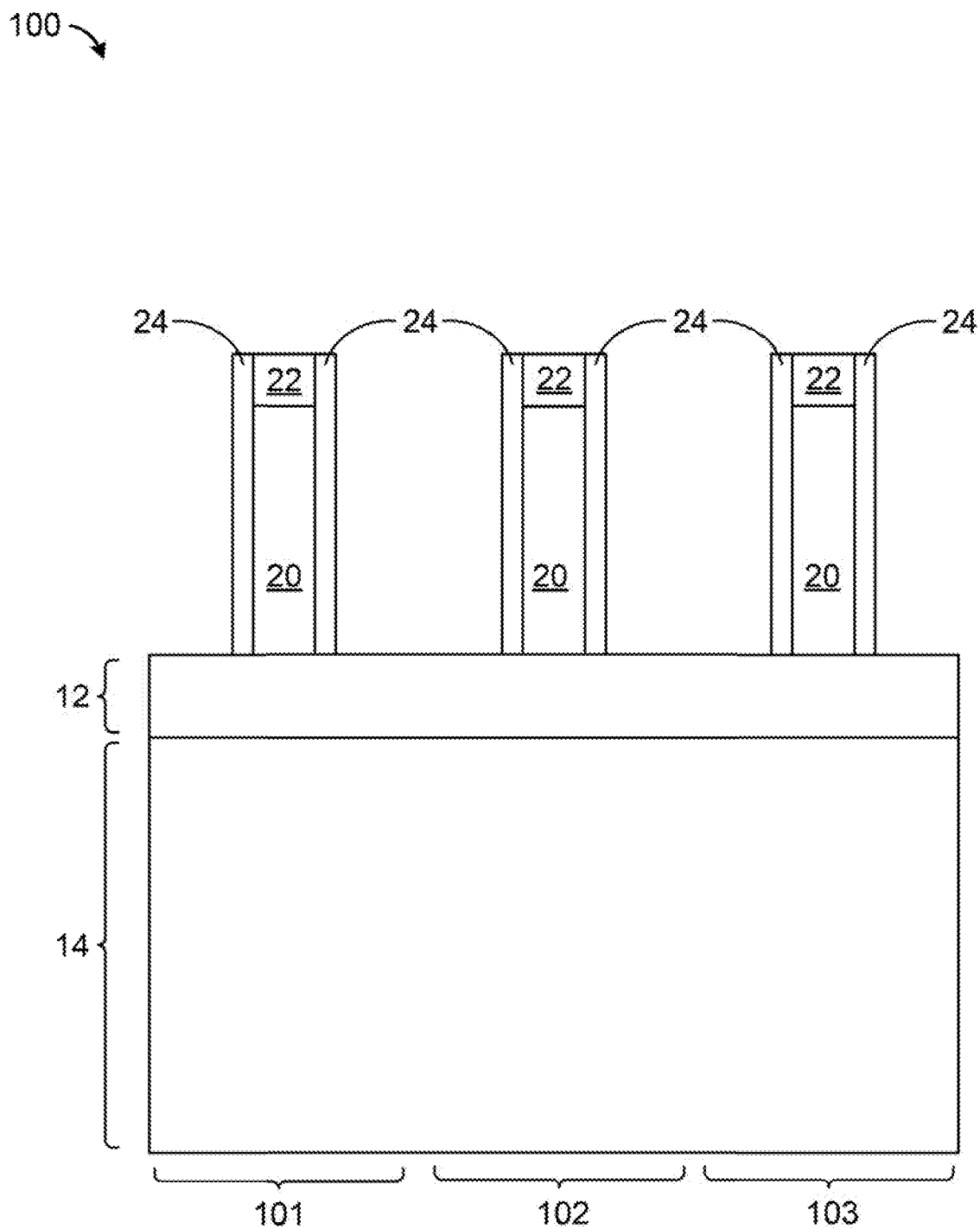
FIG. 2 illustrates a cross-sectional view of the semiconductor structure and illustrates forming a liner, according to an exemplary embodiment.

Referring now to FIG. 2, a liner 24 may be formed on exposed side surfaces of the upper fin 20, according to an embodiment. The liner 24 may be formed on either side of the upper fin 20.

The liner 24 may be conformally deposited on exposed surfaces of the structure 100, according to an exemplary embodiment. The liner 24 may be formed on a top surface of the hard mask 22, on a vertical side surface of the upper fin 20, on a vertical side surface of the hard mask 22, and on exposed portions of a horizontal top surface of the oxide layer 12. The liner 24 may be selectively etched such that the liner 24 remains on the vertical side surface of the upper fin 20, on a vertical side surface of the hard mask 22, and on the exposed portions of the horizontal top surface of the oxide layer 12 adjacent to the upper fin 20. The liner 24 is removed from the horizontal top surface of the hard mask 22 and remaining portion of the horizontal top surface of the oxide layer 12. The liner 24 may be deposited using typical deposition techniques, for example, atomic layer deposition (ALD), molecular layer deposition (MLD), chemical vapor deposition (CVD), physical vapor deposition (PVD), and spin on techniques, followed by an anisotropic vertical etch process such as a reactive ion etch (RIE), or any suitable etch process. The material of the liner 24 may include silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The liner 24 may further include dopants such as lanthanum and aluminum. In an embodiment, the liner 24 may include hafnium oxide. In an embodiment, the liner 24 may have a lateral thickness ranging from about 2 nm to about 5 nm and ranges there between, although a thickness less than 2 nm and greater than 5 nm may be acceptable. In some cases, the liner 24 may be referred to, and function as, a gate dielectric.

Figure 3:
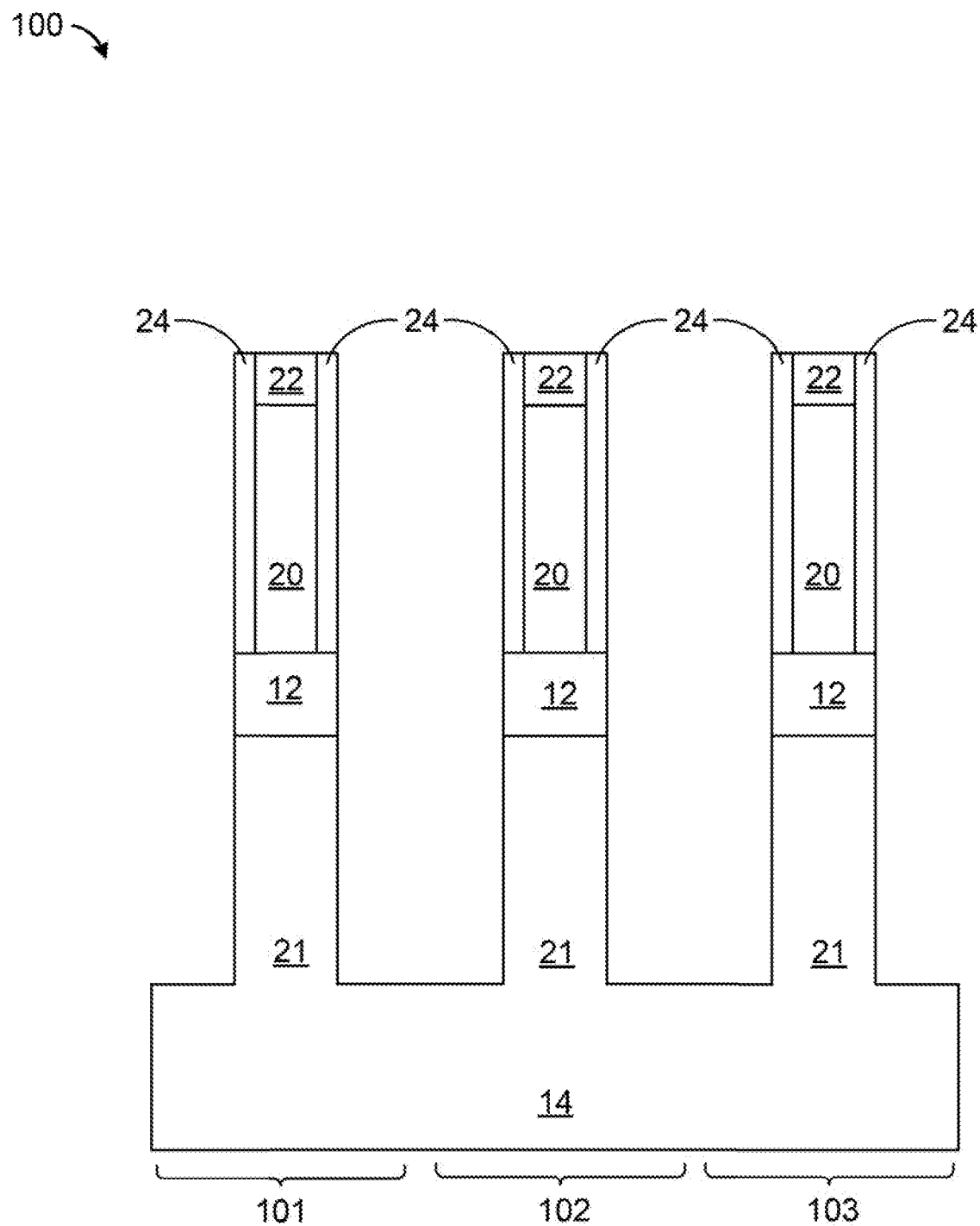
FIG. 3 illustrates a cross-sectional view of the semiconductor structure and illustrates forming a lower fin, according to an exemplary embodiment.

Referring now to FIG. 3, a lower fin 21 may be formed from the silicon layer 14, according to an embodiment. A lower fin 21 may be formed in each of the fin stack regions 101, 102, 103. Each of the fin stack regions 101, 102, 103, may include an upper fin 20 vertically stacked above and aligned with a lower fin 21. A portion of the oxide layer 12 may be an insulator between the upper fin 20 and the lower fin 21 in each of the fin stack regions 101, 102, 103. The lower fin 21 may be formed by a reactive ion etch (RIE), or any suitable etch process, to remove portions of the oxide layer 12 and the silicon layer 14, in order to form the lower fin 21. In an embodiment, the upper fin 20 may be a positive channel field effect transistor (hereinafter "PFET") and the lower fin 21 may be a negative channel field effect transistor (hereinafter "NFET"). In an alternate embodiment, the upper fin 20 may be an NFET and the lower fin 21 may be a PFET. In a further alternate embodiment, both the upper fin 20 and the lower fin 21 may be PFET, or may be NFET.

Figure 4:
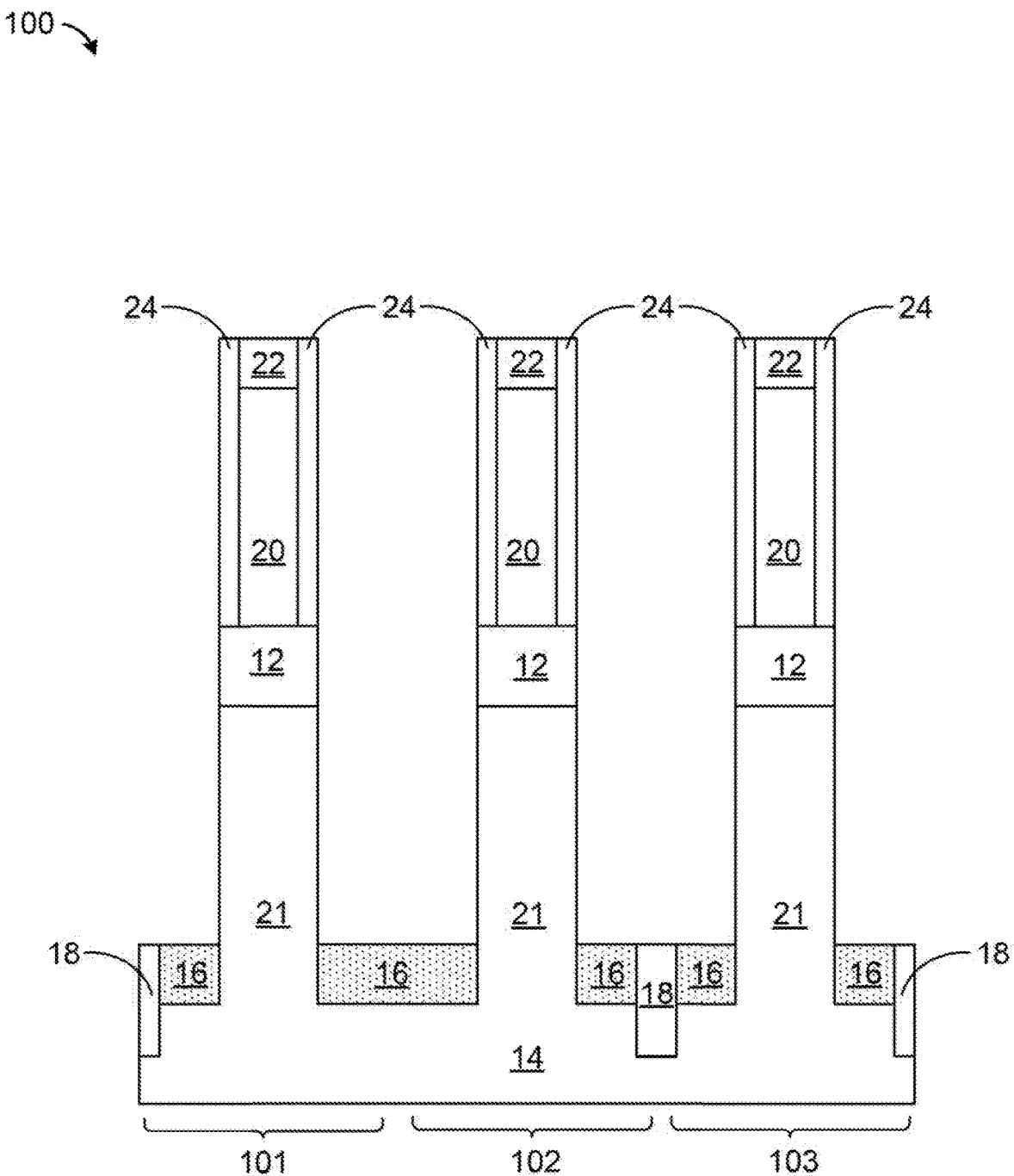
FIG. 4 illustrates a cross-sectional view of the semiconductor structure and illustrates forming an epitaxy, according to an exemplary embodiment.

Referring now to FIG. 4, an epitaxy 16 and a shallow trench isolation region (hereinafter "STI") 18 may be formed using any known techniques, according to an embodiment. The epitaxy 16 may be selectively deposited on an exposed top surface of the silicon layer 14 between the lower fin 21 and an adjacent lower fin 21, according to an embodiment. In an embodiment, the epitaxy 16 may be formed on either side of the lower fin 21. The epitaxy 16 may be adjacent to a portion of a vertical side of the lower fin 21. The epitaxy 16 performs as a lower source drain of the lower fin 21 and needs to contact the lower fin 21. Examples of various epitaxial growth techniques used in forming the epitaxy 16 may include, for example, rapid thermal chemical vapor deposition, low energy cluster beam deposition, ultra-high vacuum chemical vapor deposition, and atmospheric pressure chemical vapor deposition. In some cases, the epitaxy 16 may be formed directly on the silicon layer 14, as shown in FIG. 4. The epitaxy 16 may be doped during the epitaxy process (in-situ doping) or after the epitaxy process (ex-situ doping). A non-limiting list of exemplary epitaxial materials are: silicon germanium alloy (SiGe), silicon (Si), in-situ boron or gallium doped SiGe or Si, in situ phosphorus or arsenic doped Si or SiGe, with doping levels ranging from $1E19/cm^3$ to $1.5E21\ cm^3$, with $4E20\ cm^3$ to $9E20\ cm^3$ dopant levels preferred. The epitaxy 16 may serve as a lower source/drain region of a lower FET in the fin stack regions 101, 102, 103 and has direct contact to the fin 21. In an embodiment, the lower FET is an N-FET and the epitaxy 16 is boron or gallium doped. Thermal anneal such as laser anneal, rapid thermal anneal, flash anneal may be performed to activate dopants. In an embodiment, the epitaxy 16 may be about 20 nm high above a surface of the substrate 10, although a height of less than 10 nm and greater than 20 nm may be acceptable. In most cases, the height of the epitaxy 16 is proportional to the fin pitch or width between adjacent fins. A width of the epitaxy 16 may preferably extend from the lower fin 21 and the adjacent lower fin 21, which typically ranges between from about 15 nm to 30 nm. In an embodiment, the width of the epitaxy 16 extends from the lower fin 21 to the adjacent lower fin 21, merging the epitaxy 16 between fin stack region 101, 102.

The STI 18 may be embedded in the silicon layer 14 where a portion of the silicon layer 14 and a portion of the epitaxy 16 has been removed between the lower fin 21 and an adjacent lower fin 21. After formation of the STI 18, a portion of the epitaxy 16 may remain between the lower fin 21 and the STI 18. The STI 18 serves to isolate a source drain region of the epitaxy 16 adjacent to the lower fin 21 from a source drain region of the epitaxy 16 adjacent to an adjacent lower fin 21. A horizontal top surface of the STI 18 may be essentially coplanar with a horizontal top surface of the epitaxy 16. In an embodiment, the STI 18 is formed by lithography and etch techniques, and is formed between the lower fin 21 and an adjacent lower fin 21. Alternatively, the STI 18 may be patterned by sidewall image transfer (SIT) technique. The STI 18 may be formed between fin stack regions 101, 102, 103. In an embodiment, the STI 18 may be 30 nm deep below a surface of the epitaxy 16 which is adjacent to the STI 18, although depths greater than 30 nm and less than 30 nm may be acceptable. A width of the STI 18 may range from 30 nm to 50 nm, and ranges there between, although a width less than 30 nm and greater than 50 nm may be acceptable depending on spacing between individual devices.

As shown in FIG. 4, the STI 18 is not formed between the fin stack regions 101, and 102, and the STI 18 is formed between the fin stack regions 102, 103. The STI 18 may be selectively formed between fin stack regions 101, 102, 103, based on contact requirements for the structure, to allow for future contact formation in those areas where the STI 18 is not formed, as will be further described later.

In the illustrated embodiment, the merged epitaxy 16 between the fin stack regions 101, 102 allows future formation of a contact to the epitaxy 16 of the fin stack region 101 by removal of the fin stack region 102 and forming a contact in the fin stack region 102. The contact is connected from the fin stack region 102 to the fin stack region 101, via the merged epitaxy 16, forming a connection to the lower source drain of the lower FET of the fin stack region 101, as further described below.

Figure 5:
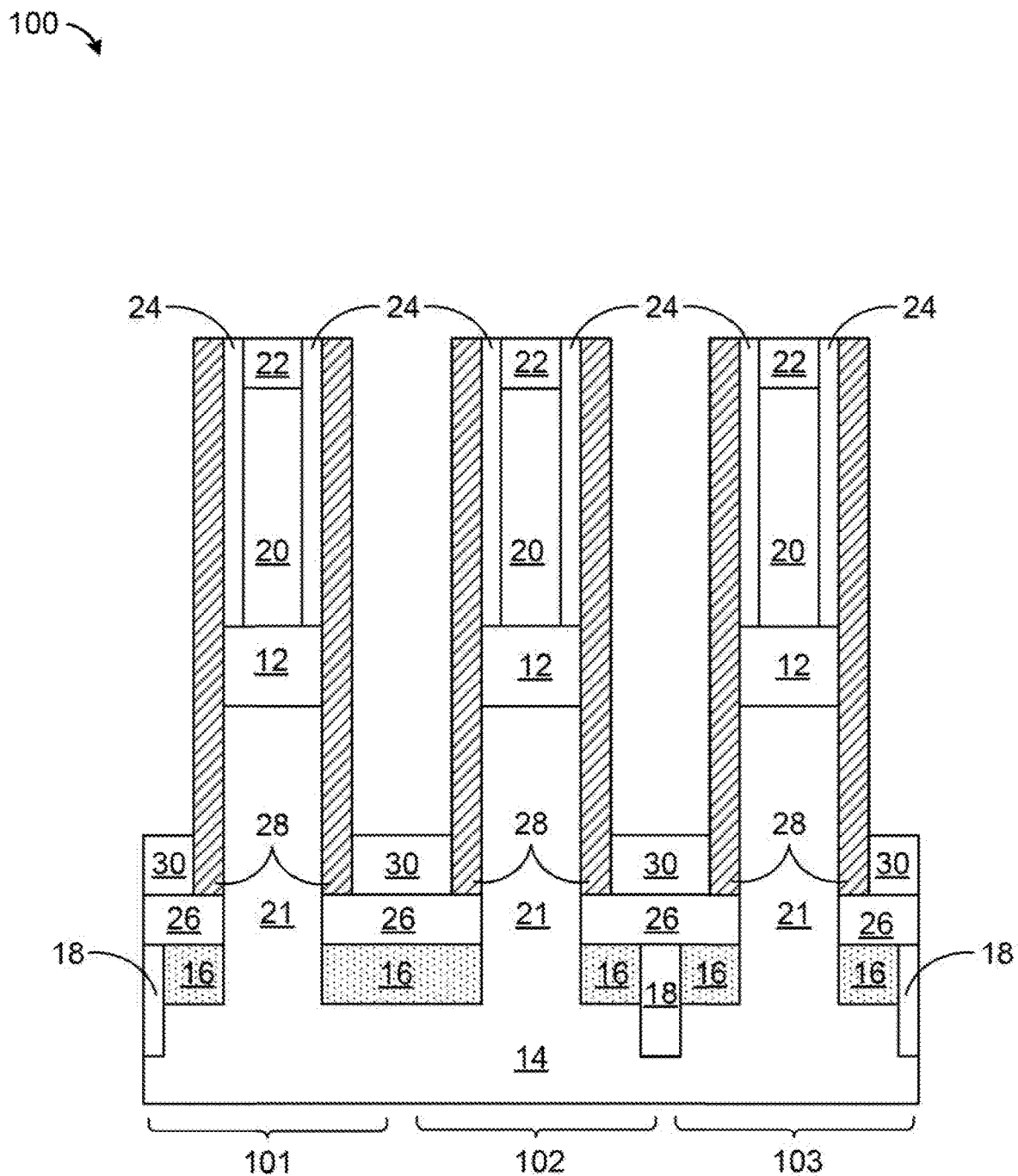
FIG. 5 illustrates a cross-sectional view of the semiconductor structure and illustrates forming a gate stack, according to an exemplary embodiment.

Referring now to FIG. 5, a spacer 26, a gate stack 28, and an interlayer dielectric (hereinafter "ILD") 30 may be formed, according to an exemplary embodiment.

The spacer 26 may be formed directly on exposed top surfaces of the structure 100, according to an exemplary embodiment. The spacer 26 may be formed by conformally depositing or growing a dielectric material, followed by a combination of dry and wet anisotropic etch and recessing steps to remove the dielectric material from a top of the hard mask 22, a top of the liner 24, and from vertical surfaces of the structure 100, such as sidewalls of the liner 24, the oxide layer 12 and the lower fin 21. After removal of portions of the dielectric material, the dielectric material may remain on an exposed top surface of the STI 18, and an exposed top surface of the epitaxy 16, forming the spacer 26. The spacer 26 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an anisotropic vertical etch process such as a reactive ion etch (RIE), or any suitable etch process. In an embodiment, the spacer 26 may include one or more layers. The spacer 26 may cover a horizonal top surface of the STI 18 and a horizonal top surface of the epitaxy 16. In an embodiment, the spacer 26 may include any dielectric material such as silicon oxide, silicon oxynitride, silicon nitride, SiBCN, SiOC, low-k dielectric or any combination of these materials. In an embodiment, the spacer 26 may be nitride. In an alternate embodiment, the spacer 26 may be oxide. In an embodiment, the spacer 26 may have a vertical thickness ranging from about 4 nm to about 10 nm, and ranges there between, although a thickness less than 4 nm and greater than 10 nm may be acceptable.

The gate stack 28 may be conformally deposited on the structure 100, according to an exemplary embodiment. The gate stack 28 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the gate stack 28 may include one or more layers. In an embodiment, the gate stack 28 may include a work function metal including titanium nitride, tantalum nitride, titanium carbide or titanium aluminum carbide. The gate stack 28 may be deposited on the top surface of the spacer 26. Excess material of the gate stack 28 may be removed (using a conventional removal method, such as, for example, RIE) to leave the gate stack 28 only on sidewalls of the liner 24, sidewalls of the oxide layer 12 and sidewalls of the lower fin 21. A lower portion of the gate stack 28 may cover a portion of the spacer 26 adjacent to the lower fin 21. In an embodiment, the gate stack 28 for the lower fin 21 may be titanium nitride for an NFET. The gate stack 28 may have a conformal thickness ranging from about 4 nm to about 6 nm, and ranges there between, although a thickness less than 4 nm and greater than 6 nm may be acceptable.

The ILD 30 may be formed directly on exposed top surfaces of the structure 100, according to an exemplary embodiment. The ILD 30 may be formed by conformally depositing or growing a dielectric material, followed by a combination of dry and wet anisotropic etch and recessing steps to remove the dielectric material from the top of the hard mask 22, the top of the liner 24, a top of the gate stack 28, and from vertical surfaces of the structure 100, such as sidewalls of the gate stack 28. After removal of portions of the ILD 30, the ILD 30 may remain on an exposed horizontal top surface of the spacer 26. The ILD 30 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an anisotropic vertical etch process such as a reactive ion etch (RIE), or any suitable etch process. In an embodiment, the ILD 30 may include one or more layers. The ILD 30 may cover the top surface of the spacer 26 and a portion of a vertical side surface of the gate stack 28. In an embodiment, the ILD 30 may include any dielectric material such as silicon oxide, silicon oxynitride, silicon nitride, SiBCN, SiOC, low-k dielectric or any combination of these materials. In an embodiment, the ILD 30 may be nitride. In an alternate embodiment, the ILD 30 may be oxide. In an embodiment, the ILD 30 may have a thickness ranging from about 10 nm to about 30 nm, and ranges there between, although a thickness less than 10 nm and greater than 30 nm may be acceptable.

Figure 6:
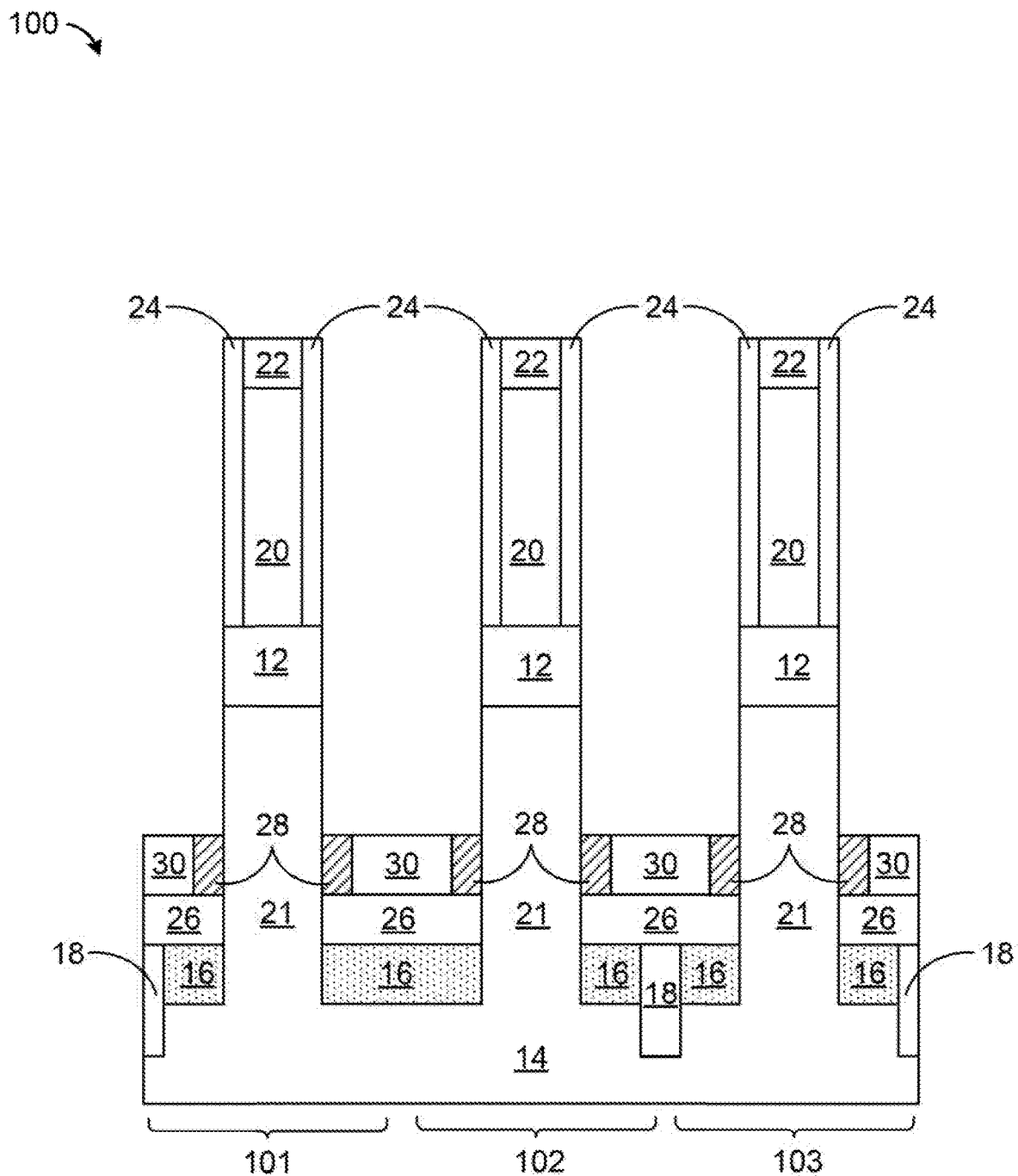
FIG. 6 illustrates a cross-sectional view of the semiconductor structure and illustrates forming a gate, according to an exemplary embodiment.

Referring now to FIG. 6, an exposed portion of the gate stack 28 may be removed, where a remaining portion of the gate stack 28 may be an NFET gate for the lower fin 21, according to an exemplary embodiment. The portion of the gate stack 28 which is removed may be removed by a wet etching process or WETS. The wet etching processes may employ special chemical solutions including, for example, tetramethylammonium hydroxide (TMAH) solution, potassium hydroxide (KOH) solution, and ethylene diamine and pyrocatechol (EDP) solution. Alternatively, a wet etching processes that relies on a mixture solution of for example HF-HNO3-H2SO4, may be used. The material used for the wet etching process may be selective such that the top surface of the hard mask 22, the top surface and the vertical size surface of the liner 24, the vertical side surface of the oxide layer 12, and an exposed vertical side surface of the lower fin 21 are not etched, while the exposed portion of the gate stack 28 is removed and a small portion of the ILD 30 may be removed, such that a horizontal top surface of the remaining portion of the gate stack 28 is coplanar with the top surface of the ILD 30. The remaining portion of the gate stack 28 may have a height ranging from about 15 nm to about 30 nm, and ranges there between, although a thickness less than 15 nm and greater than 30 nm may be acceptable.

Figure 7:
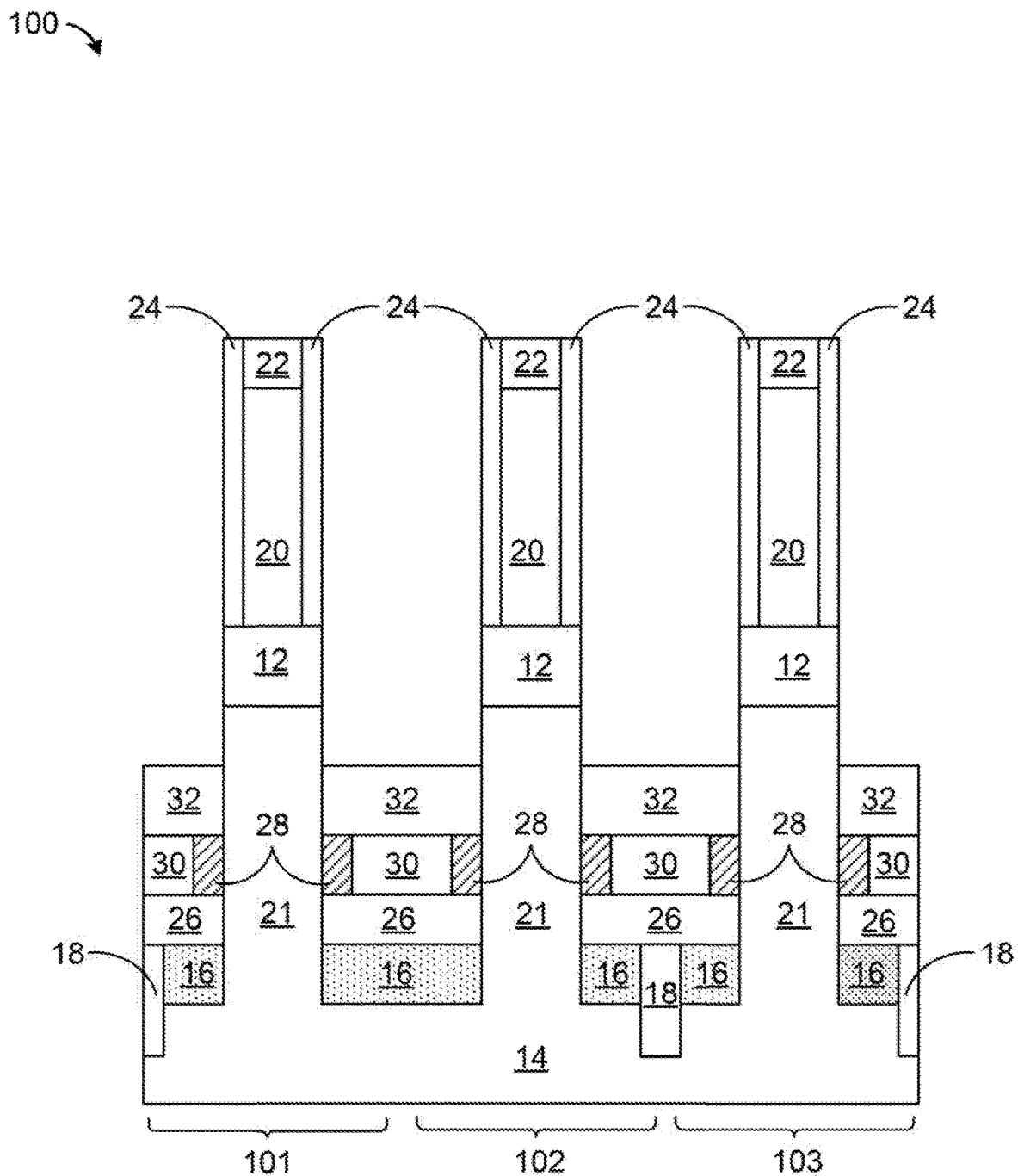
FIG. 7 illustrates a cross-sectional view of the semiconductor structure and illustrates forming a spacer, according to an exemplary embodiment.

Referring now to FIG. 7, a spacer 32 may be formed, according to an exemplary embodiment. The spacer 32 may be formed as described above for the spacer 26. The spacer 32 may cover a top surface of the remaining portion of the gate stack 28, a top surface of the ILD 30, and a portion of a vertical side surface of the lower fin 21.

Figure 8:
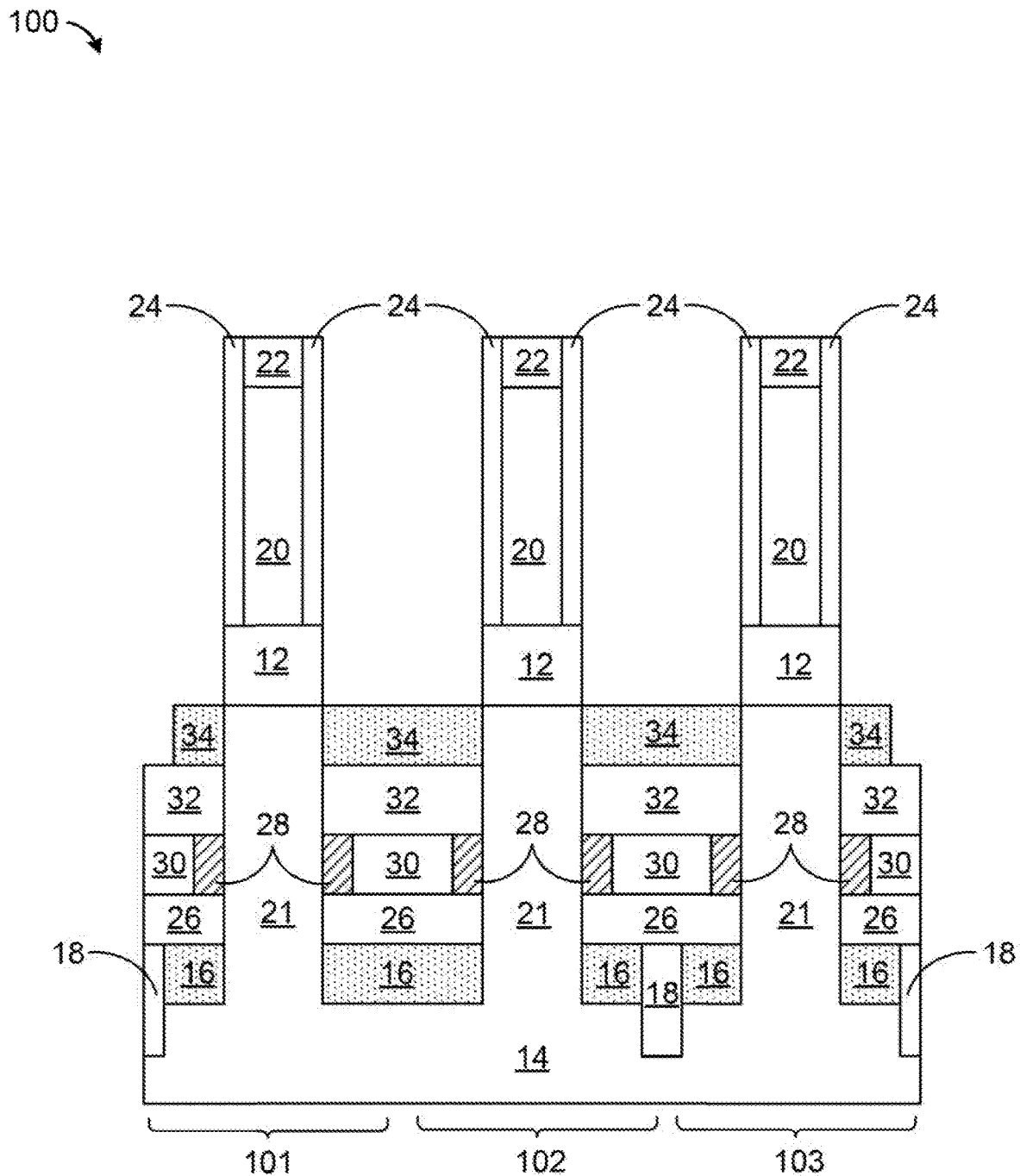
FIG. 8 illustrates a cross-sectional view of the semiconductor structure and illustrates forming an epitaxy, according to an exemplary embodiment.

Referring now to FIG. 8, an epitaxy 34 may be formed, according to an exemplary embodiment. The epitaxy 34 may be formed as described above for the epitaxy 16. The epitaxy 34 may be deposited on an exposed top surface of the spacer 32 between the lower fin 21 and an adjacent lower fin 21, according to an embodiment. The epitaxy 34 may be formed on either side of the lower fin 21. The epitaxy 34 may serve as an upper source/drain region of the lower FET in the fin stack regions 101, 102, 103. The lower FET may be an N-FET and the epitaxy 34 may be boron or gallium doped. Thermal anneal such as laser anneal, rapid thermal anneal, flash anneal may be performed to activate dopants. In an embodiment, the epitaxy 34 may be about 20 nm high above a surface of the spacer 32 between the lower fin 21 and an adjacent lower fin 21, although depths less than 20 nm and greater than 20 nm may be acceptable. A width of the epitaxy 34 may preferably extend from the lower fin 21 and the adjacent lower fin 21, which typically ranges between from about 15 nm to 30 nm, although a width less than 15 nm and greater than 30 nm may be acceptable depending on a pitch of the lower fins 21.

Figure 9:
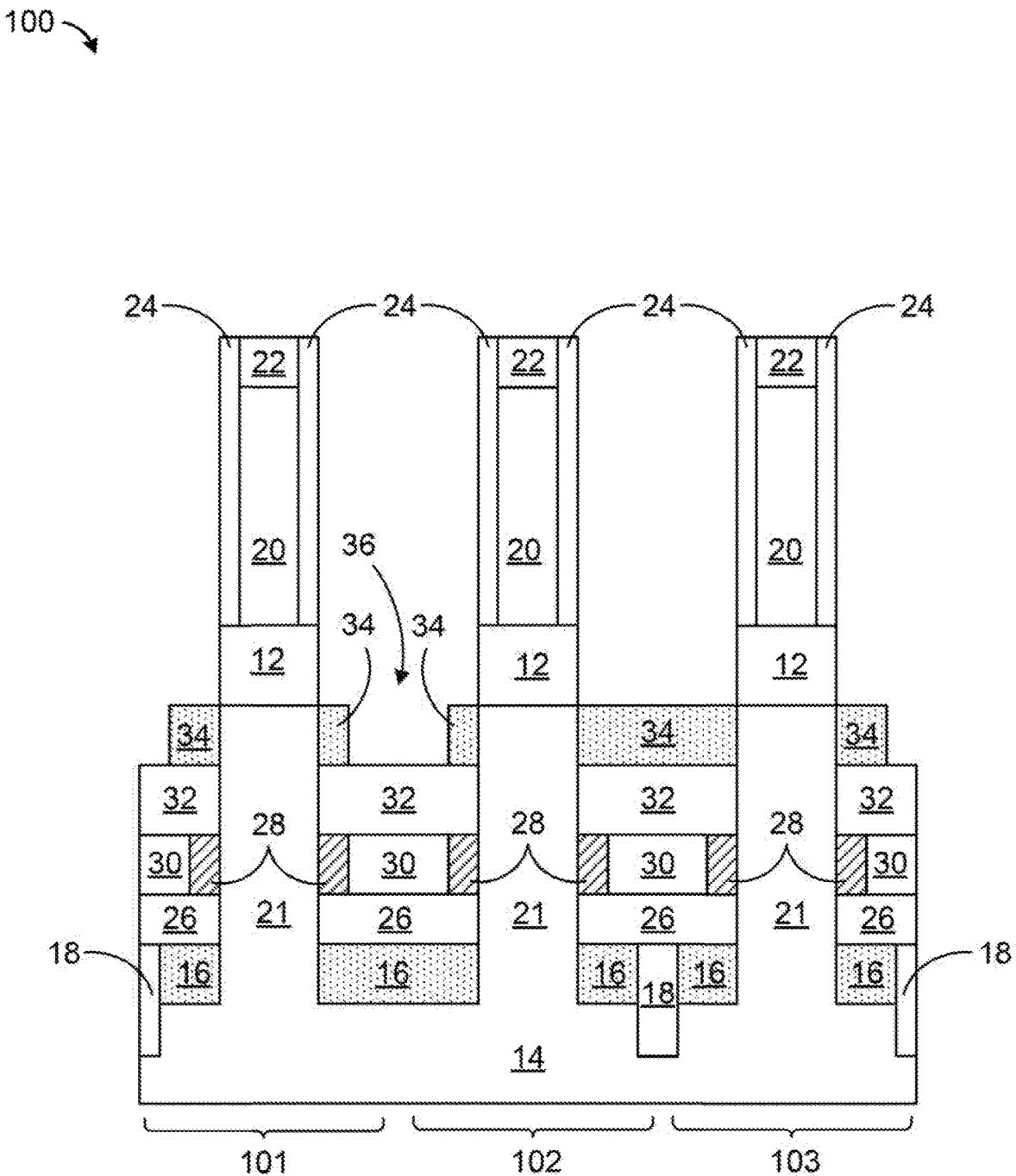
FIG. 9 illustrates a cross-sectional view of the semiconductor structure and illustrates forming an opening in the epitaxy, according to an exemplary embodiment.

Referring now to FIG. 9, an opening 36 may be formed, according to an exemplary embodiment. A photo resist mask may be used to protect the epitaxy 34 between the fin stack regions 101, 102, 103, and the photo resist mask may have an opening which allows the opening 36 to be formed during recessing/etching. The opening 36 may be formed by recessing/etching the epitaxy 34 selective to the oxide layer 12, the liner 24 and the hard mask 22, until a top surface of the spacer 32 is exposed in an area between the fin stack regions 101, 102. The opening 36 may be formed using an anisotropic vertical etch process such as a reactive ion etch (RIE), or any suitable etch process. The opening 36 may be formed in one or more process steps. The epitaxy 34 may remain complete between the fin stack region 102 and the fin stack region 103. A location for the opening 36 may be determined by further plans to create a contact between fin stacks 101, 102, 103, as will be discussed further. The opening 36 allows for isolation of the epitaxy 34 of the upper source drain of the lower FET of the fin stack region 101 from the epitaxy 34 of the upper source drain of the lower FET of the fin stack region 102. As shown, the epitaxy 34 is connected between the fin stack region 102, 103. A portion of the epitaxy 34 may remain alongside the opening 36, adjacent to the fin 21 of the fin stack regions 101, 102. The photo resist mask may be removed subsequent to the recessing/etching of the epitaxy 34.

Further processing of the structure 100 may include formation of a contact in the fin stack region 102, where the fin stack region 102 is removed, and a contact formed in the fin stack region 102. The contact will provide a connection to the epitaxy 34 of the upper source drain of the lower FET in the fin stack region 103.

Figure 10:
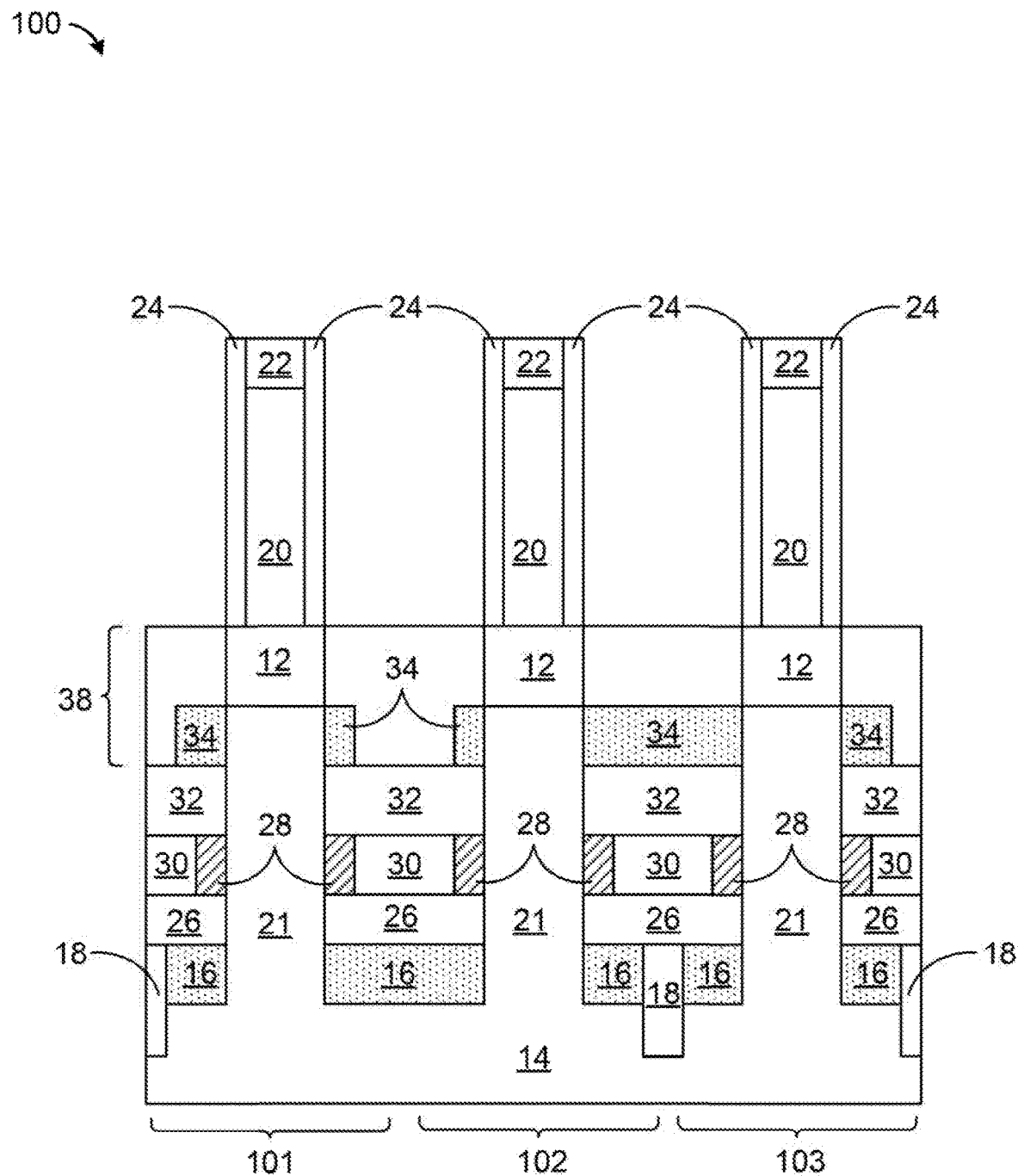
FIG. 10 illustrates a cross-sectional view of the semiconductor structure and illustrates depositing a dielectric, according to an exemplary embodiment.

Referring now to FIG. 10, a dielectric layer (hereinafter "dielectric") 38 may be formed directly on exposed top surfaces of the structure 100, according to an exemplary embodiment. The dielectric 38 may be formed by conformally depositing or growing a dielectric material, followed by a combination of dry and wet anisotropic etch and recessing steps to remove the dielectric material from a top of the hard mask 22, a top of the liner 24, and from vertical surfaces of the structure 100, such as sidewalls of the liner 24. After removal of portions of the dielectric material, the dielectric material may remain on an exposed top surface of the epitaxy 34 and on an exposed top surface of the spacer 32. The dielectric 38 may fill the opening 36, isolating the epitaxy 34 between the fin stack regions 101, 102, resulting in an unmerged epitaxy 34. The dielectric 38 may be formed as described above for the ILD 30.

Figure 11:
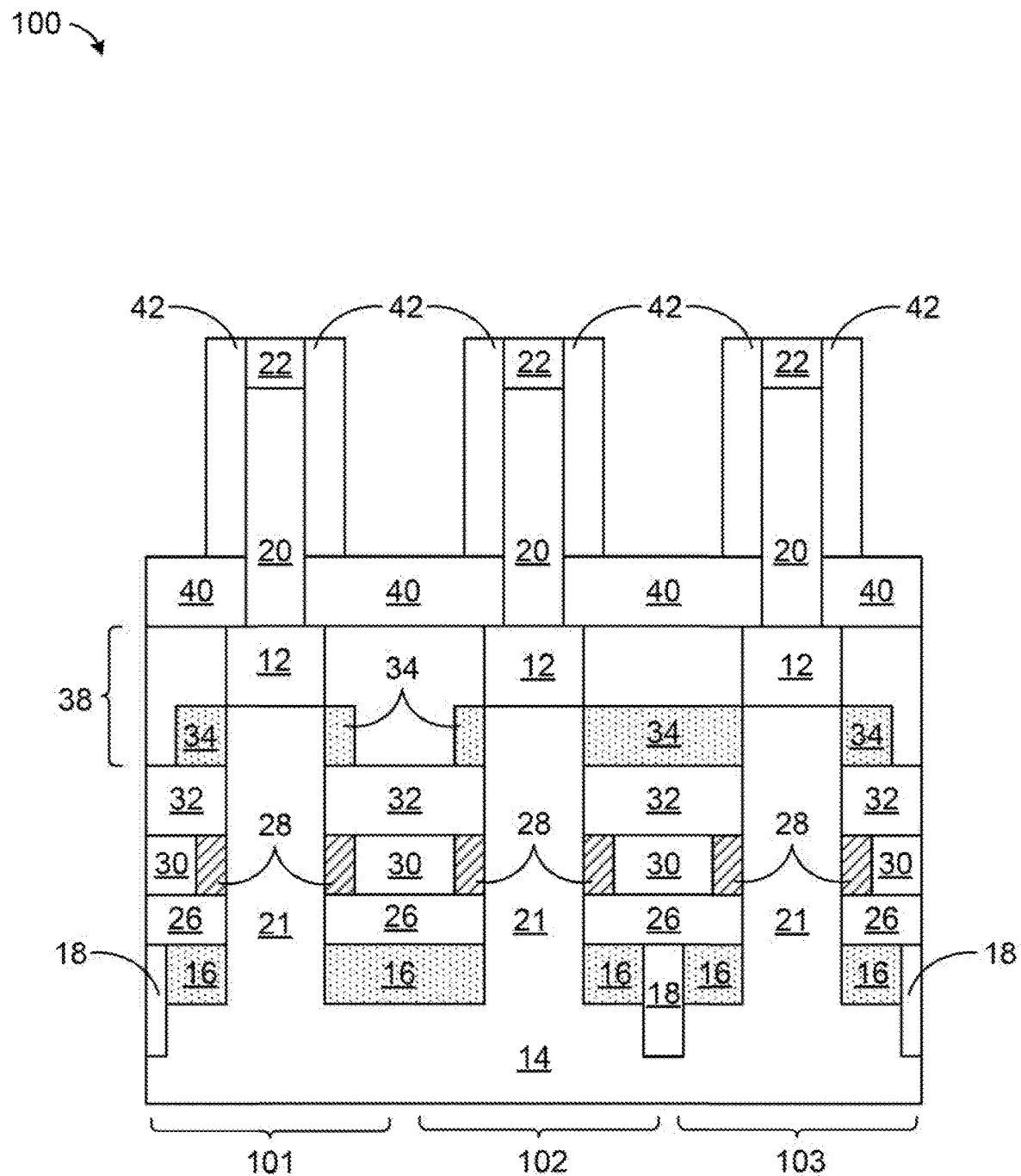
FIG. 11 illustrates a cross-sectional view of the semiconductor structure and illustrates forming liner, according to an exemplary embodiment.

Referring now to FIG. 11, the liner 24 may be removed, and an oxide layer (hereinafter "oxide") 40 and a liner 42 may be formed, according to an exemplary embodiment.

The liner 24 may be removed by an anisotropic vertical etch process such as a reactive ion etch (RIE), or any suitable etch process. A photo resist mask may be used to protect the dielectric 38 between the fin stack regions 101, 102, 103, and the top of the hard mask 22. The liner 24 may be recessed/etched selective to the dielectric 38 and the hard mask 22, until a vertical side surface of the upper fin 20 is exposed in an area between the oxide layer 12, the dielectric

38 and the hard mask 22. The liner 24 may be removed by an anisotropic vertical etch process such as a reactive ion etch (RIE), or any suitable etch process. The liner 24 may be removed in one or more process steps. The photo resist mask may be removed via further processing steps.

The oxide 40 may be formed on a top surface of the dielectric 38 and on a portion of a top surface of the oxide layer 12. The oxide 40 may be selectively etched such that the oxide 40 remains on a portion of a vertical side surface of the upper fin 20. The oxide 40 may be formed as described above for the liner 24. In an embodiment, the oxide 40 may include an oxide. In an embodiment, the oxide 40 may have a thickness ranging from about 2 nm to about 5 nm and ranges there between, although a thickness less than 2 nm and greater than 5 nm may be acceptable.

The liner 42 may be formed on a top surface of the oxide 40. The liner 42 may be selectively etched such that the liner 42 remains on a portion of a vertical side surface of the upper fin 20 and on the vertical side surface of the hard mask 22. The liner 42 may be formed as described above for the liner 24. In an embodiment, the oxide 40 may include a nitride. In an embodiment, the liner 42 may have a thickness ranging from about 2 nm to about 5 nm and ranges there between, although a thickness less than 2 nm and greater than 5 nm may be acceptable.

Figure 12:
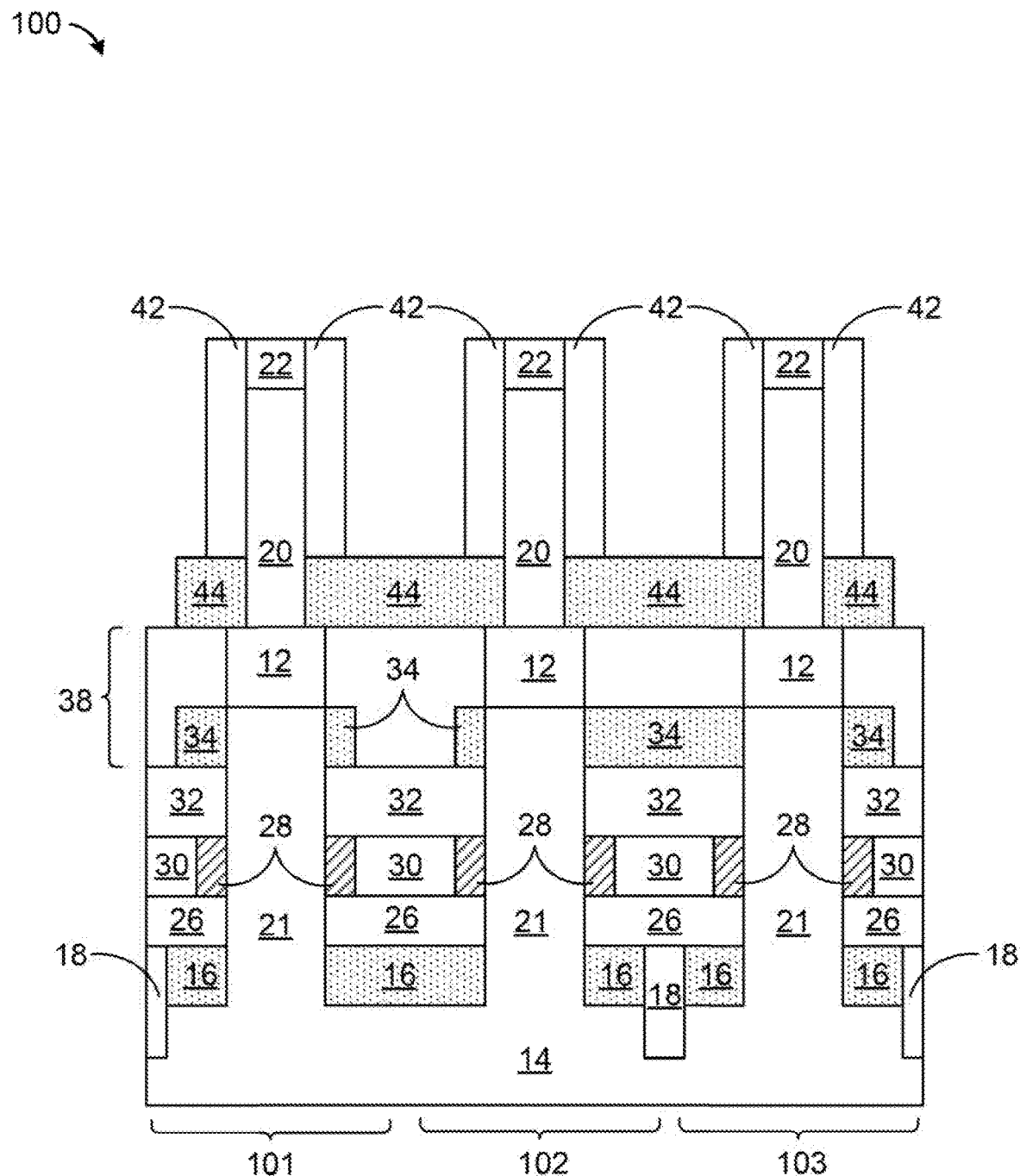
FIG. 12 illustrates a cross-sectional view of the semiconductor structure and illustrates forming an epitaxy, according to an exemplary embodiment.

Referring to FIG. 12, the oxide 40 may be removed, and an epitaxy 44 may be formed, according to an exemplary embodiment.

The oxide 40 may be removed using known photolithography and etch processes and may be performed in multiple steps. The technique used to remove the oxide 40 may be selective such that the top surface of the dielectric 38, an exposed top surface of the oxide layer 12, an exposed portion of the vertical size surface of the fin 20, a bottom surface, a vertical side surface and a top surface of the liner 42, and the top surface of the hard mask 22 are not etched.

The epitaxy 44 may be formed as described above in regards to the epitaxy 16. The epitaxy 16 may serve as a lower source/drain region of an upper FET in the fin stack regions 101, 102, 103. The upper FET may be a PFET and the epitaxy 44 may be silicon germanium doped. A bottom surface of the epitaxy 44 may be coplanar with the top surface of the dielectric 38 and may be coplanar with the top surface of the exposed portion of the oxide layer 12. A vertical side surface of the epitaxy 44 may be coplanar with a portion of the vertical side surface of the upper fin 20. A portion of a top surface of the epitaxy 44 may be coplanar with a bottom surface of the liner 42.

Figure 13:
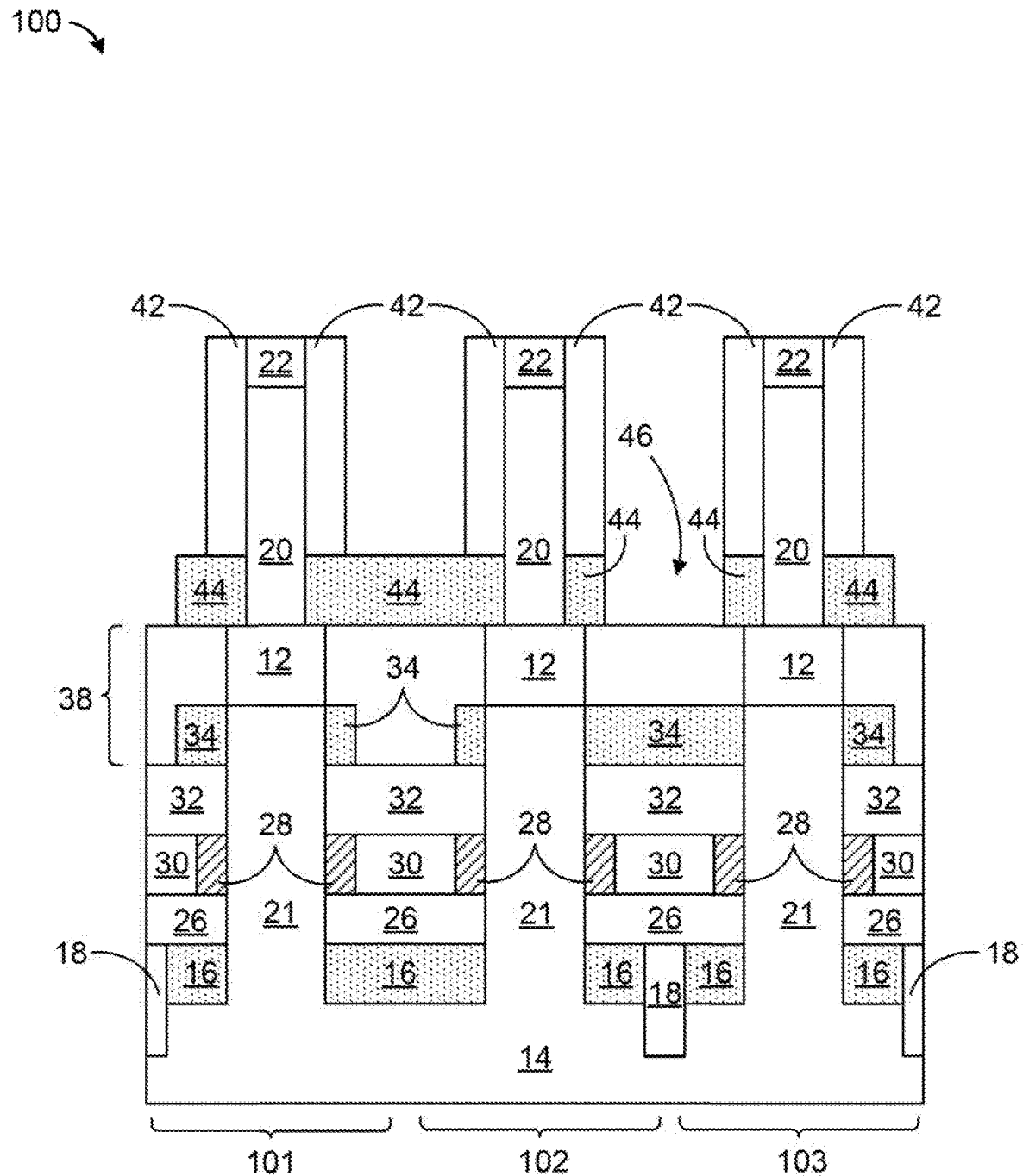
FIG. 13 illustrates a cross-sectional view of the semiconductor structure and illustrates forming an opening in the epitaxy, according to an exemplary embodiment.

Referring now to FIG. 13, an opening 46 may be formed, according to an exemplary embodiment. A photo resist mask may be used to protect the epitaxy 44 between the fin stack regions 101, 102, 103, and the photo resist mask may have an opening which allows the opening 46 to be formed during recessing/etching. The opening 46 may be formed by recessing/etching the epitaxy 44 selective to the liner 42 and the hard mask 22, until a top surface of the dielectric 38 is exposed in an area between the fin stack regions 102, 103. The opening 46 may be formed using an anisotropic vertical etch process such as a reactive ion etch (RIE), or any suitable etch process. The opening 46 may be formed in one or more process steps. The epitaxy 44 may remain complete between the fin stack region 101 and the fin stack region 102. A portion of the epitaxy 44 may remain alongside the opening 46, adjacent to the fin stack regions 102, 103. The photo resist mask may be removed subsequent to the recessing/etching of the epitaxy 44. A vertical side surface of the opening 46 may align with a vertical side surface the liner 42.

A location for the opening 46 may be determined by further plans to create a contact between fin stacks, as will be discussed further. The opening 46 isolates the epitaxy 44 of the upper FET in the fin stack region 102 from the epitaxy 44 of the upper fin 20 in the fin stack region 103. The epitaxy 44 remains connected or merged between the upper fin 20 of the fin stack region 101, 102. The fin stack region 102 may be removed in future processing steps, and a contact formed in the fin stack region 102. The contact will be connected to the lower source drain of the upper FET of the fin stack region 101.

Figure 14:
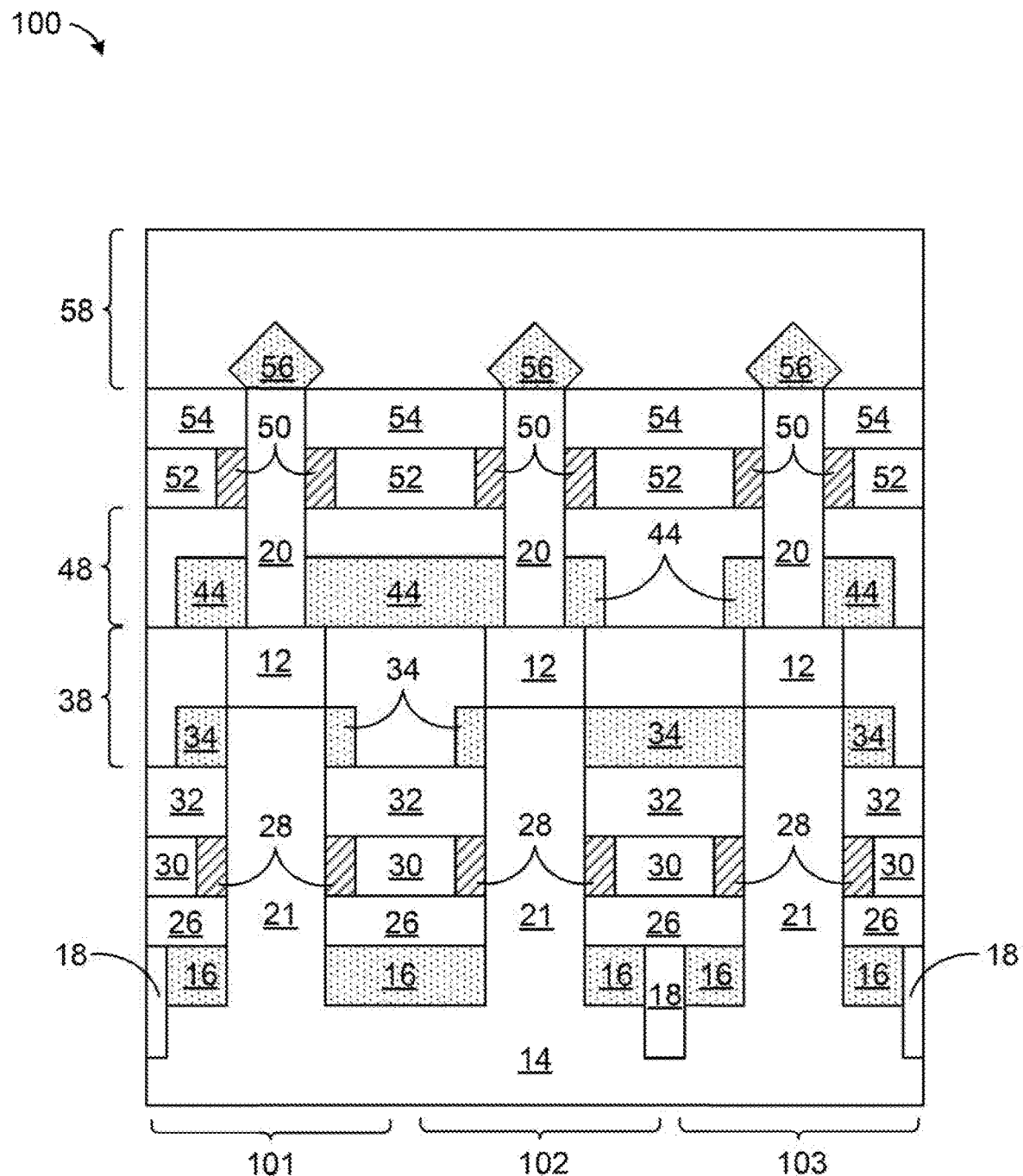
FIG. 14 illustrates a cross-sectional view of the semiconductor structure and illustrates forming a spacer and an epitaxy, according to an exemplary embodiment.

Referring now to FIG. 14, the liner 42 and the hard mask 22 may be removed, and a spacer 48, a gate stack 50, an interlayer dielectric (hereinafter "ILD") 52, a spacer 54, an epitaxy 56 and an ILD 58 may be formed, according to an exemplary embodiment.

The liner 42 may be removed by an anisotropic vertical etch process such as a reactive ion etch (RIE), or any suitable etch process. A photo resist mask may be used to protect the epitaxy 44 between the fin stack regions 101, 102, 103, the hard mask 22 and the dielectric 38. The liner 42 may be recessed/etched selective to the epitaxy 44 and the hard mask 22, until a portion of the vertical side surface of the upper fin 20 is exposed in an area between the epitaxy 44 and the hard mask 22. The liner 42 may be removed by an anisotropic vertical etch process such as a reactive ion etch (RIE), or any suitable etch process. The liner 42 may be removed in one or more process steps. The photo resist mask may be removed via further processing steps.

The hard mask 22 may be removed by an anisotropic vertical etch process such as a reactive ion etch (RIE), or any suitable etch process. A photo resist mask may be used to protect the epitaxy 44 between the fin stack regions 101, 102, 103 and the dielectric 38. The hard mask 22 may be recessed/etched selective to the epitaxy 44, the upper fin 20 and the dielectric 38, until a horizonal top surface of the upper fin 20 is exposed. The hard mask 22 may be removed by an anisotropic vertical etch process such as a reactive ion etch (RIE), or any suitable etch process. The hard mask 22 may be removed in one or more process steps. The photo resist mask may be removed via further processing steps. The liner 42 and the hard mask 22 may be removed in one or more processing steps.

The spacer 48 may be formed directly on exposed top surfaces of the structure 100. The spacer 48 may be formed as described in regards to the spacer 26. The spacer 48 may cover a portion of a vertical side surface of the upper fin 20. The spacer 48 may fill the opening 46. The spacer 48 may cover a top surface of the epitaxy 44 and a vertical side surface of the epitaxy 44 in an area where the opening 46 was previously. The spacer 48 may cover an exposed top surface of the dielectric 38.

The gate stack 50 may be formed as described for the gate stack 28. The gate stack 50 may be deposited on a top surface of the spacer 48. Excess material of the gate stack 50 may be removed (using a conventional removal method, such as, for example, RIE) to leave the gate stack 50 only on exposed portions of the sidewalls of the upper fin 20. A lower horizontal portion of the gate stack 50 may cover a portion of the top surface of the spacer 48 adjacent to the upper fin 20. In an embodiment, the gate stack 50 for the upper fin 20 may be titanium carbide or titanium aluminum carbide for a PFET. The gate stack 50 may have a conformal thickness ranging from about 4 nm to about 6 nm, and ranges there between, although a thickness less than 4 nm and greater than 6 nm may be acceptable. The gate stack 50 may be present only on a portion of the sidewalls of the upper fin 20 above the spacer 48.

The ILD 52 may be formed as described for the ILD 30. A lower surface of the ILD 52 may be coplanar with an upper surface of the spacer 48. A vertical side surface of the ILD 52 may be coplanar with a portion of a vertical side surface of the gate stack 50.

After formation of the ILD 52, an exposed portion of the gate stack 50 may be removed, as described above in regards to the gate stack 28, and a remaining portion of the gate stack 50 may be a gate for the upper FET of the fin stack regions 101, 102, 103. A top surface of a remaining portion of the gate stack 50 may be coplanar with a top surface of the ILD 52.

The spacer 54 may be formed as described above for the spacer 26. The spacer 54 may cover a top surface of the remaining portion of the gate stack 50, a top surface of the ILD 52, and a portion of a vertical side surface of the upper fin 20. A top surface of the spacer 54 may be coplanar with the top surface of the upper fin 20.

The epitaxy 56 may be formed as described for the epitaxy 16. The epitaxy 56 may be selectively deposited on the exposed top surface of the upper fin 20. The epitaxy 56 may serve as an upper source/drain region of the upper FET in the fin stack regions 101, 102, 103. The upper FET may be an PFET and the epitaxy 56 may be silicon germanium doped.

The ILD 58 may be formed as described for the ILD 30, covering exposed top surfaces of the structure 100. A portion of a bottom surface of the ILD 58 may be coplanar with a top surface of the spacer 54. The ILD 58 may cover a side and a top of the epitaxy 56.

Figure 15:
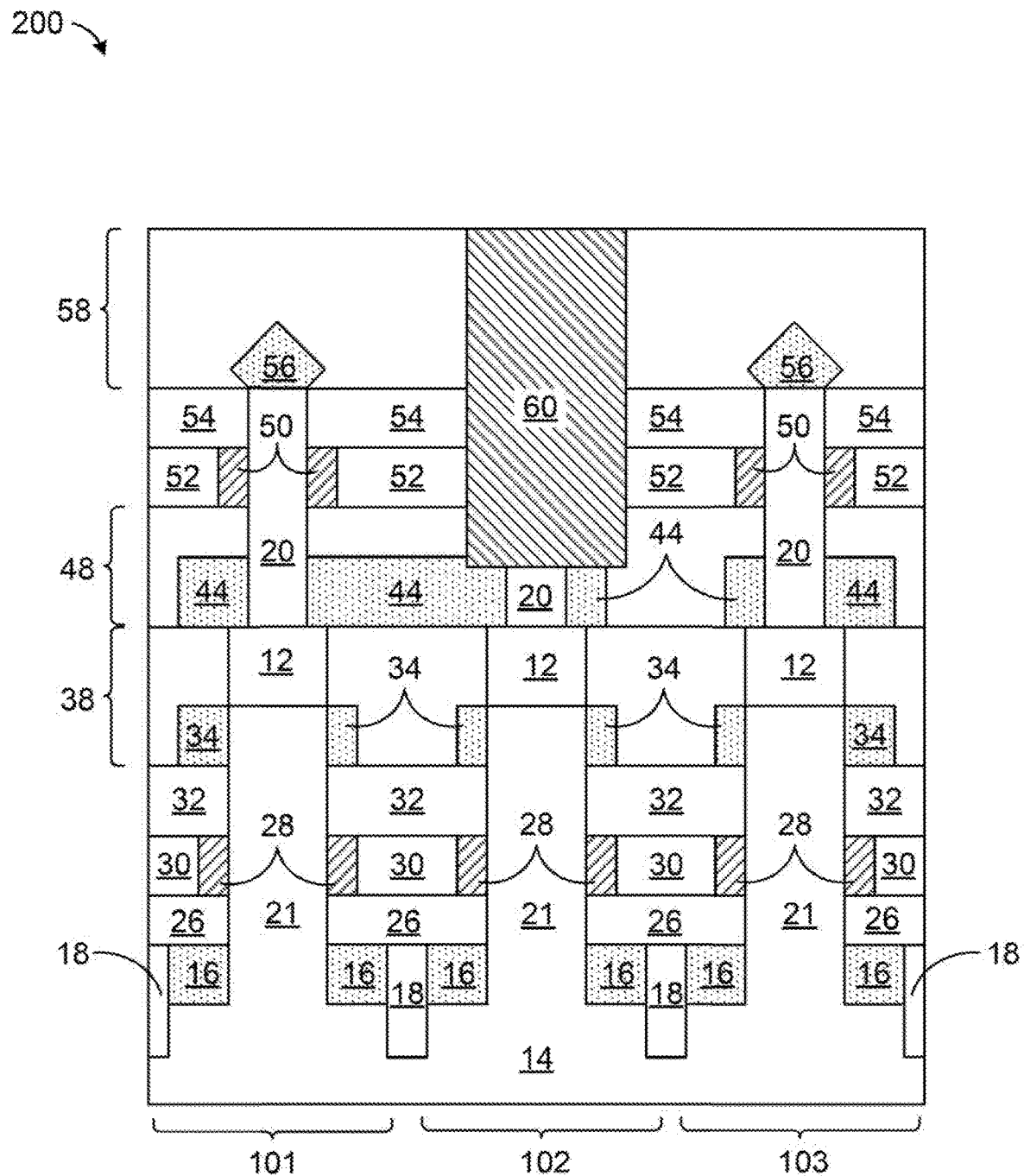
FIG. 15 illustrates a cross-sectional view of a semiconductor structure and illustrates forming a contact, according to an exemplary embodiment.
Figure 16:
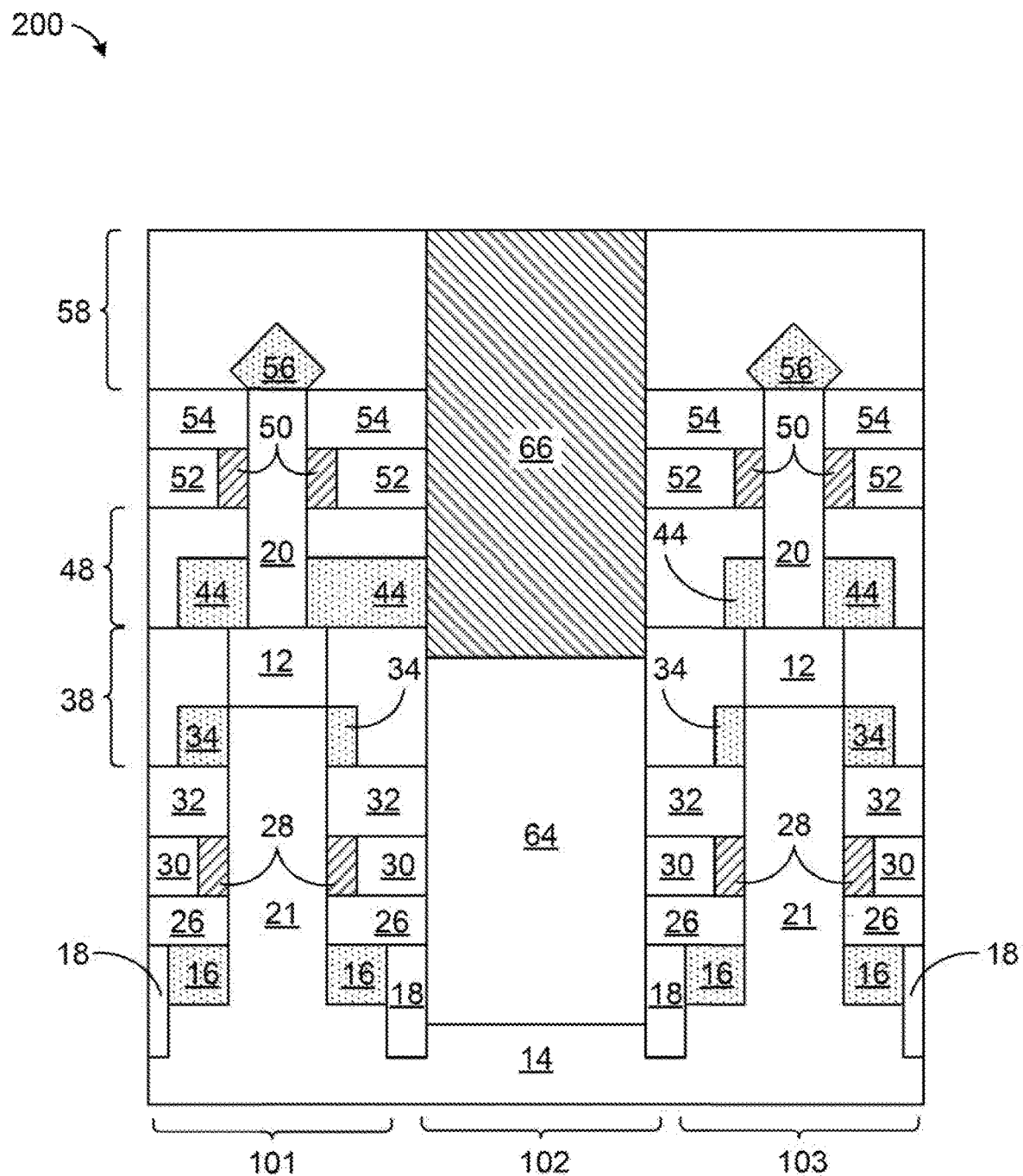
FIG. 16 illustrates a cross-sectional view of the semiconductor structure and illustrates filling a contact, according to an exemplary embodiment.

Referring to FIGS. 15 and 16, formation of a contact to the epitaxy 44 of the fin stack region 101 of a structure 200 is shown, according to an exemplary embodiment. The structure 200 is identical to the structure 100, except as specified.

As shown in FIG. 15, a first opening in the structure 200 may be formed, not shown, and a contact 60 formed in the opening. The first opening which may be formed as described for the opening 36. The first opening may be formed by removal of a portion of the fin stack region 102, which includes a portion of the ILD 58, the epitaxy 56, the gate stack 50, a portion of the spacer 54, a portion of the ILD 52, and a portion of the upper fin 20, all surrounding the fin stack region 102.

The first opening may be filled forming the contact 60, using conventional deposition techniques including, but not limited to: atomic layer deposition (ALD), chemical vapor deposition (CVD), molecular beam deposition (MBD), pulsed laser deposition (PLD), or liquid sourced misted chemical deposition (LSMCD). The contact 60, may then be may be polished using a chemical mechanical polishing (CMP) technique until a top surface of contact 60 is substantially coplanar with a top surface of the ILD 58. The contact 60 may be made from any known metal, e.g. Al, W, Cu, Zr, Ta, Hf, Ti, Ru, Pa, metal oxide, metal carbide, metal nitride, transition metal aluminides (e.g. Ti3Al, ZrAl), TaC, TiC, TaMgC, and any combination of those materials. The contact 60 may have one or more layers. In an embodiment, the contact 60 may have a bottom layer of Ti or TiN and a top layer of T or Cu. The contact 60 may be bordered on the bottom by the epitaxy 44 and the upper fin 20. The contact 60 may be bordered on a vertical side by a portion of the epitaxy 44, the spacer 48, the ILD 52, the spacer 54 and the ILD 58. The contact 60 may have a top which is substantially flush with the top of ILD 58.

The contact 60 forms an electrical contact to the epitaxy 44 of the fin stack region 102. As the epitaxy 44 is connected between the fin stack regions 101, 102, the contact 60 serves as a contact to the bottom source/drain of the upper FET of the fin stack region 101.

Comparing the structure 200 with the structure 100, comparisons are made between the epitaxy 16, the epitaxy 34, and the epitaxy 44.

The structure 100 has the epitaxy 16 connected between the fin stack regions 101, 102, and isolated between the fin stack regions 102, 103. The epitaxy 34 is isolated between the fin stack regions 101, 102, and connected between the fin stack regions 102, 103. The epitaxy 44 is connected between the fin stack regions 101, 102 and is isolated between the fin stack regions 102, 103.

The structure 200 has the epitaxy 16 isolated between both the fin stack regions 101,102 and the fin stack regions 102, 103. The epitaxy 34 is isolated between both the fin stack regions 101,102 and the fin stack regions 102, 103. The epitaxy 44 is connected between the fin stack regions 101, 102, and isolated between the fin stack regions 102,103.

As shown in FIG. 16, an alternate embodiment for forming a contact to the epitaxy 44 of the fin stack region 102 may be formed, for the structure 200. The embodiment may include forming a second opening, not shown, and a dielectric 64 may fill part of the second opening and a contact 66 may be formed in a remainder of the second opening. The contact 66 may provide an electrical connection to the lower source drain region of the upper FET of the fin stack region 101, in an alternate embodiment compared to the description of FIG. 15.

The second opening which may be formed as described for the opening 36. The second opening may be formed by removal of the fin stack region 102, which includes a portion of the ILD 58, the epitaxy 56, the gate stack 50, a portion of the spacer 54, a portion of the ILD 52, the upper fin 20, the oxide layer 12, the epitaxy 34, a portion of the spacer 32, a portion of the ILD 30, the gate stack 28, a portion of the spacer 26, the epitaxy 16, and a portion of the silicon layer 14, of the fin stack region 102.

The dielectric 64 may be formed in the second opening, partially filling the second opening. The dielectric 64 may be formed as described for the dielectric 38. The dielectric 64 may be bordered on the bottom by the silicon layer 14. The dielectric 64 may be bordered on a vertical edge by the STI 18, the spacer 26, the ILD 30, the spacer 32, and the dielectric 38.

The contact 66 may be formed in a remaining portion of the second opening as described for the contact 60. The contact 66 may be bordered on the bottom by the dielectric 64. The contact 66 may be bordered on a vertical edge by a portion of the epitaxy 44, the spacer 48, the ILD 52, the spacer 54 and the ILD 58. The contact 66 may have a top which is substantially flush with the top of ILD 58.

The contact 66 may provide an electrical contact to the epitaxy 44 of the fin stack region 102. As the epitaxy 44 is connected between the fin stack regions 101, 102, the contact 66 serves as a contact to the bottom source/drain of the upper FET of the fin stack region 101.

Figure 17:
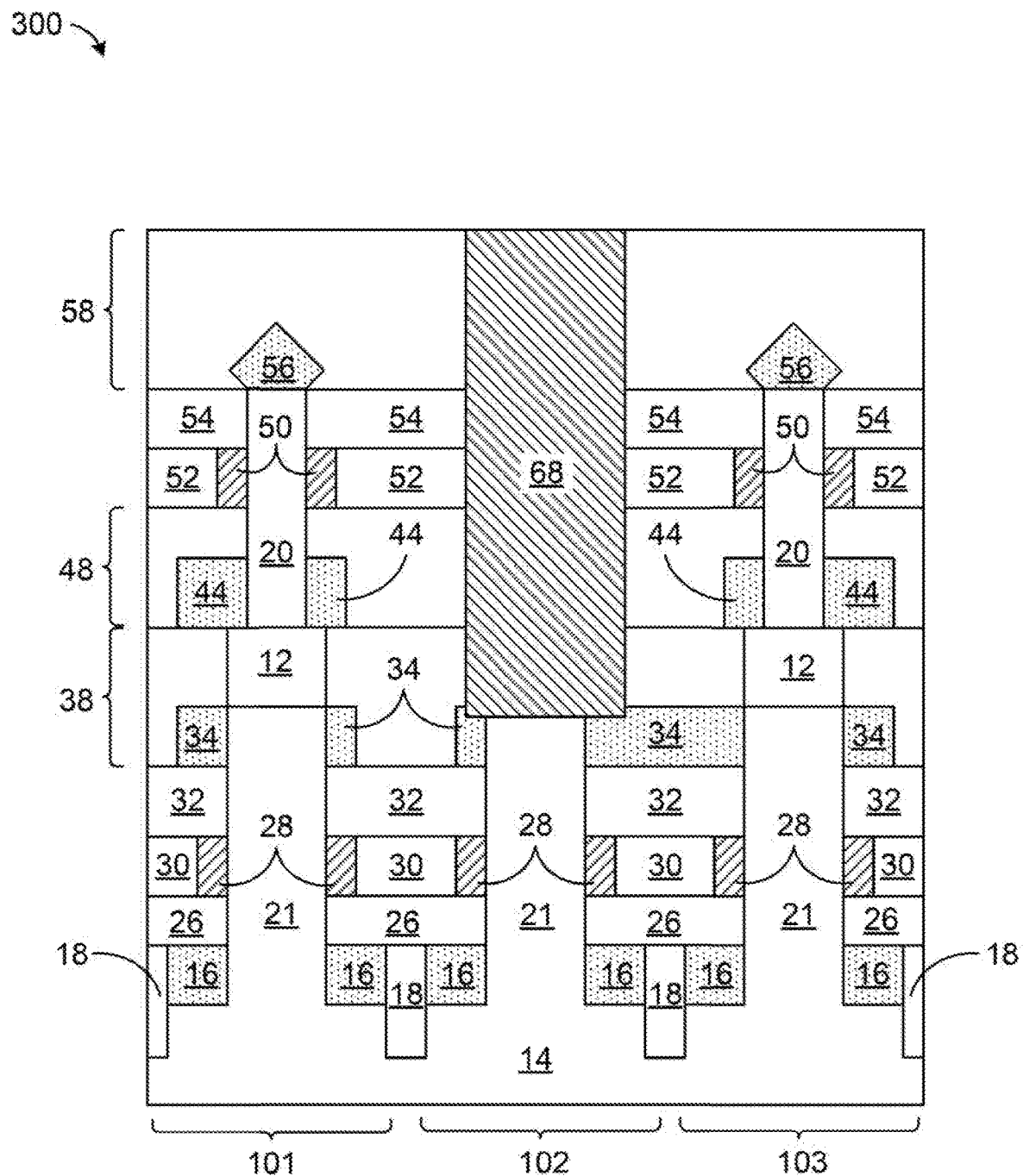
FIG. 17 illustrates a cross-sectional view of a semiconductor structure and illustrates forming a contact, according to an exemplary embodiment.
Figure 18:
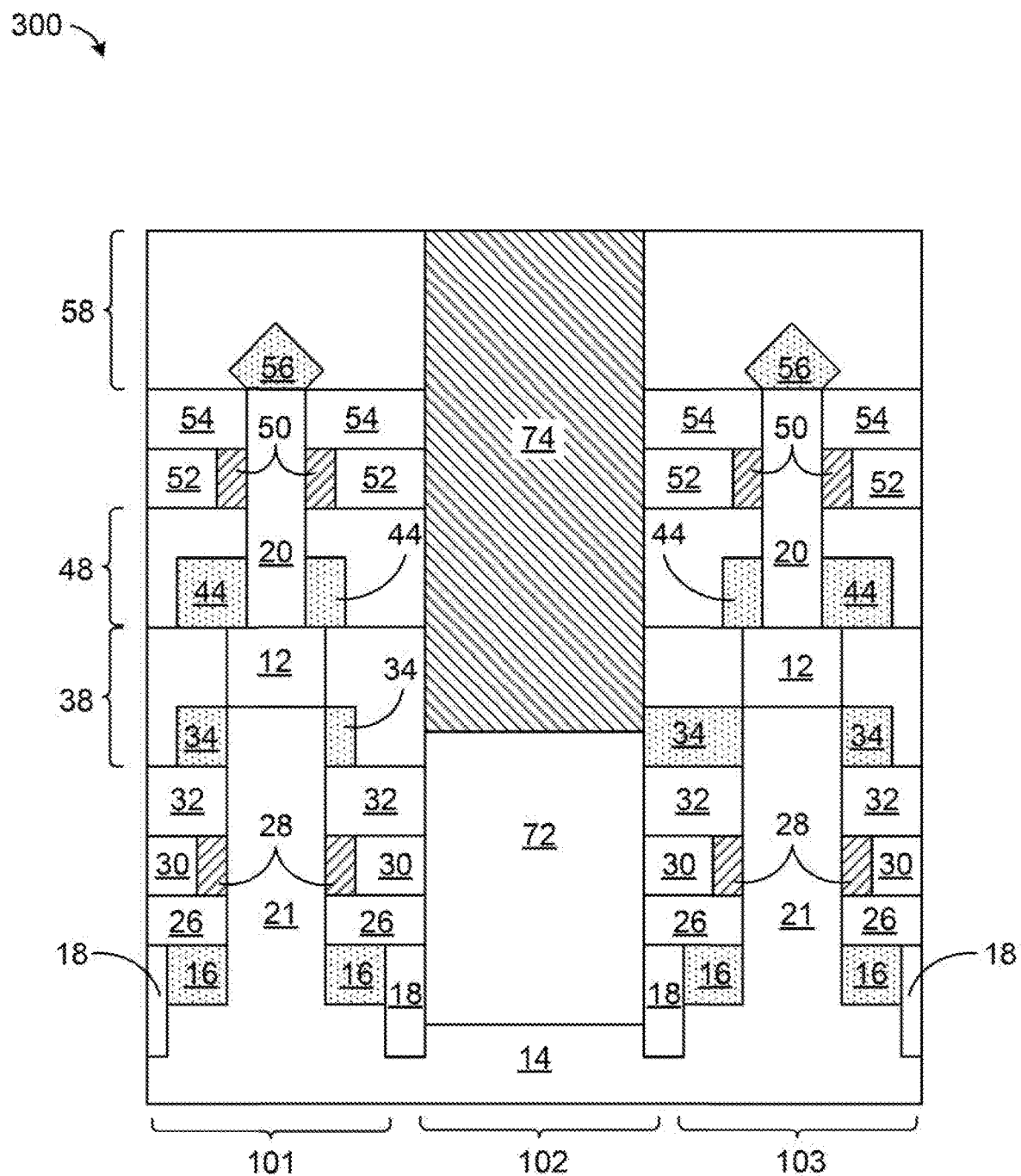
FIG. 18 illustrates a cross-sectional view of the semiconductor structure and illustrates forming a contact, according to an exemplary embodiment.

Referring to FIGS. 17 and 18, formation of a contact to the epitaxy 34 of the fin stack region 103 of a structure 300 is shown, according to an exemplary embodiment. The structure 300 is identical to the structure 100, except as specified.

As shown in FIG. 17, a third opening in the structure 300 may be formed, not shown, and a contact 68 formed in the third opening. The third opening which may be formed as described for the opening 36. The third opening may be formed by removal of the fin stack region 102, which includes a portion of the ILD 58, the epitaxy 56, the gate stack 50, a portion of the spacer 54, a portion of the ILD 52, the upper fin 20, the epitaxy 44, the oxide layer 12, a portion of the dielectric 38, a portion of the lower fin 21 and a portion of the epitaxy 34, all surrounding the fin stack region 102. The contact 68 may formed as described for the contact 60. The contact 68 may be bordered on the bottom by the epitaxy 34 and the lower fin 21. The contact 68 may be bordered on a vertical edge by a portion of the epitaxy 34, the dielectric 38, the spacer 48, the ILD 52, the spacer 54 and the ILD 58. The contact 68 may have a top which is substantially flush with the top of ILD 58.

The contact 68 may provide an electrical contact to the epitaxy 34 of the fin stack region 102. As the epitaxy 34 is connected between the fin stack regions 102, 103, the contact 68 serves as a contact to the upper source/drain of the lower FET of the fin stack region 103.

Comparing the structure 300 with the structure 100, comparisons are made between the epitaxy 16, the epitaxy 34, and the epitaxy 44.

The structure 100 has the epitaxy 16 connected between the fin stack regions 101, 102, and isolated between the fin stack regions 102, 103. The epitaxy 34 is isolated between the fin stack regions 101, 102, and connected between the fin stack regions 102, 103. The epitaxy 44 is connected between the fin stack regions 101, 102 and is isolated between the fin stack regions 102, 103.

The structure 300 has the epitaxy 16 isolated between both the fin stack regions 101,102 and the fin stack regions 102, 103. The epitaxy 34 is isolated between the fin stack regions 101,102 and connected between the fin stack regions 102, 103. The epitaxy 44 is isolated both between the fin stack regions 101, 102 and the fin stack regions 102,103.

As shown in FIG. 18, an alternate embodiment for forming a contact 74 to the epitaxy 34 of the fin stack region 102 may be formed, for the structure 300. The embodiment may include forming a fourth opening, not shown, and a dielectric 72 may fill part of the fourth opening and a contact 74 may be formed in a remainder of the fourth opening. The contact 74 may provide an electrical connection to the upper source drain region of the lower FET of the fin stack region 103, in an alternate embodiment compared to the description of FIG. 17.

The fourth opening which may be formed as described for the opening 36. The fourth opening may be formed by removal of the fin stack region 102, which includes a portion of the ILD 58, the epitaxy 56, the gate stack 50, a portion of the spacer 54, a portion of the ILD 52, the upper fin 20, the oxide layer 12, the epitaxy 34, a portion of the spacer 32, a portion of the ILD 30, the gate stack 28, a portion of the spacer 26, the epitaxy 16, and a portion of the silicon layer 14, of the fin stack region 102.

The dielectric 72 may be formed in the fourth opening, partially filling the fourth opening. The dielectric 72 may be formed as described for the dielectric 38. The dielectric 72 may be bordered on the bottom by the silicon layer 14. The dielectric 72 may be bordered on a vertical edge by the STI 18, the spacer 26, the ILD 30, the spacer 32, and the dielectric 38.

The contact 74 may be formed in a remaining portion of the second opening as described in regards to the contact 60. The contact 74 may be bordered on the bottom by the dielectric 72. The contact 74 may be bordered on a vertical edge by a portion of the epitaxy 44, the spacer 48, the ILD 52, the spacer 54 and the ILD 58. The contact 74 may have a top which is substantially flush with the top of ILD 58.

The contact 74 may provide an electrical contact to the epitaxy 34 of the fin stack region 102. As the epitaxy 34 is connected between the fin stack regions 102, 103, the contact 74 serves as a contact to the top source/drain of the lower FET of the fin stack region 103.

Figure 19:
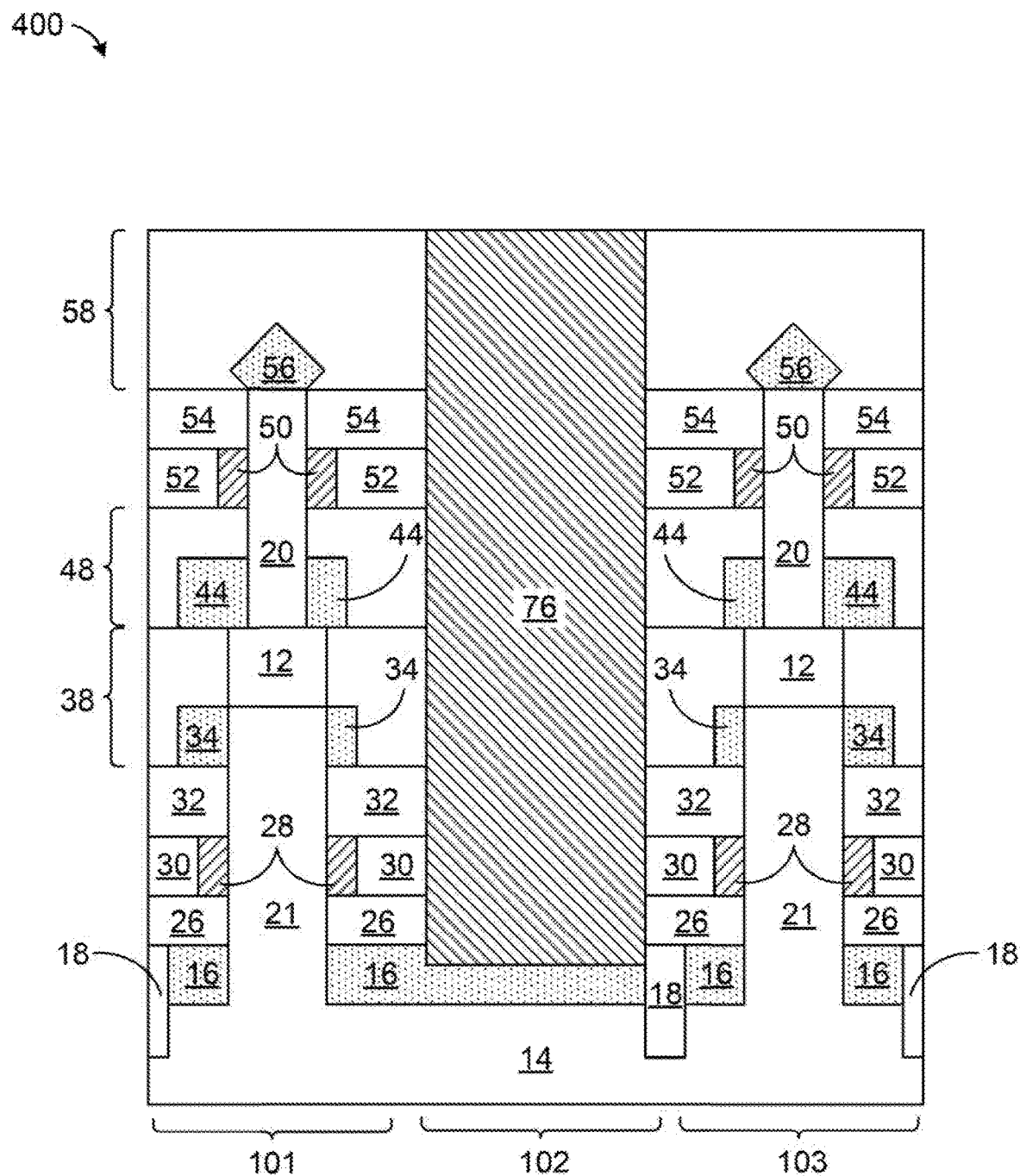
FIG. 19 illustrates a cross-sectional view of a semiconductor structure and illustrates forming a contact, according to an exemplary embodiment.

Referring to FIG. 19, formation of a contact to the epitaxy 16 of the fin stack region 101 of a structure 400 is shown, according to an exemplary embodiment. The structure 400 is identical to the structure 100, except as specified.

As shown in FIG. 19, a fifth opening in the structure 400 may be formed, not shown, and a contact 76 formed in the fifth opening. The fifth opening which may be formed as described above for the opening 36. The fifth opening may be formed by removal of the fin stack region 102, which includes a portion of the ILD 58, the epitaxy 56, the gate stack 50, a portion of the spacer 54, a portion of the ILD 52, the upper fin 20, the epitaxy 44, the oxide layer 12, a portion of the dielectric 38, a portion of the lower fin 21, a portion of the epitaxy 34, a portion of the spacer 32, a portion of the ILD 30, the gate stack 28, a portion of the spacer 26, and a portion of the epitaxy 16, of the fin stack region 102. The contact 76 may formed as described for the contact 60. The contact 76 may be bordered on the bottom by the epitaxy 16. The contact 76 may be bordered on a vertical edge by a portion of the epitaxy 16, the spacer 26, the ILD 30, the spacer 32, the dielectric 38, the spacer 48, the ILD 52, the spacer 54 and the ILD 58. The contact 76 may have a top which is substantially flush with the top of ILD 58.

The contact 76 may provide an electrical contact to the epitaxy 16 of the fin stack region 102. As the epitaxy 16 is connected between the fin stack regions 101, 102, the contact 76 serves as a contact to the lower source/drain of the lower FET of the fin stack region 101.

Comparing the structure 400 with the structure 100, comparisons are made between the epitaxy 16, the epitaxy 34, and the epitaxy 44.

The structure 100 has the epitaxy 16 connected between the fin stack regions 101, 102, and isolated between the fin stack regions 102, 103. The epitaxy 34 is isolated between the fin stack regions 101, 102, and connected between the fin stack regions 102, 103. The epitaxy 44 is connected between the fin stack regions 101, 102 and is isolated between the fin stack regions 102, 103.

The structure 400 has the epitaxy 16 connected or merged between the fin stack regions 101, 102, and isolated between the fin stack regions 102, 103. The epitaxy 34 is isolated or unmerged both between the fin stack regions 101,102 and the fin stack regions 102, 103. The epitaxy 44 is isolated both between the fin stack regions 101, 102 and the fin stack regions 102,103.

Figure 20:
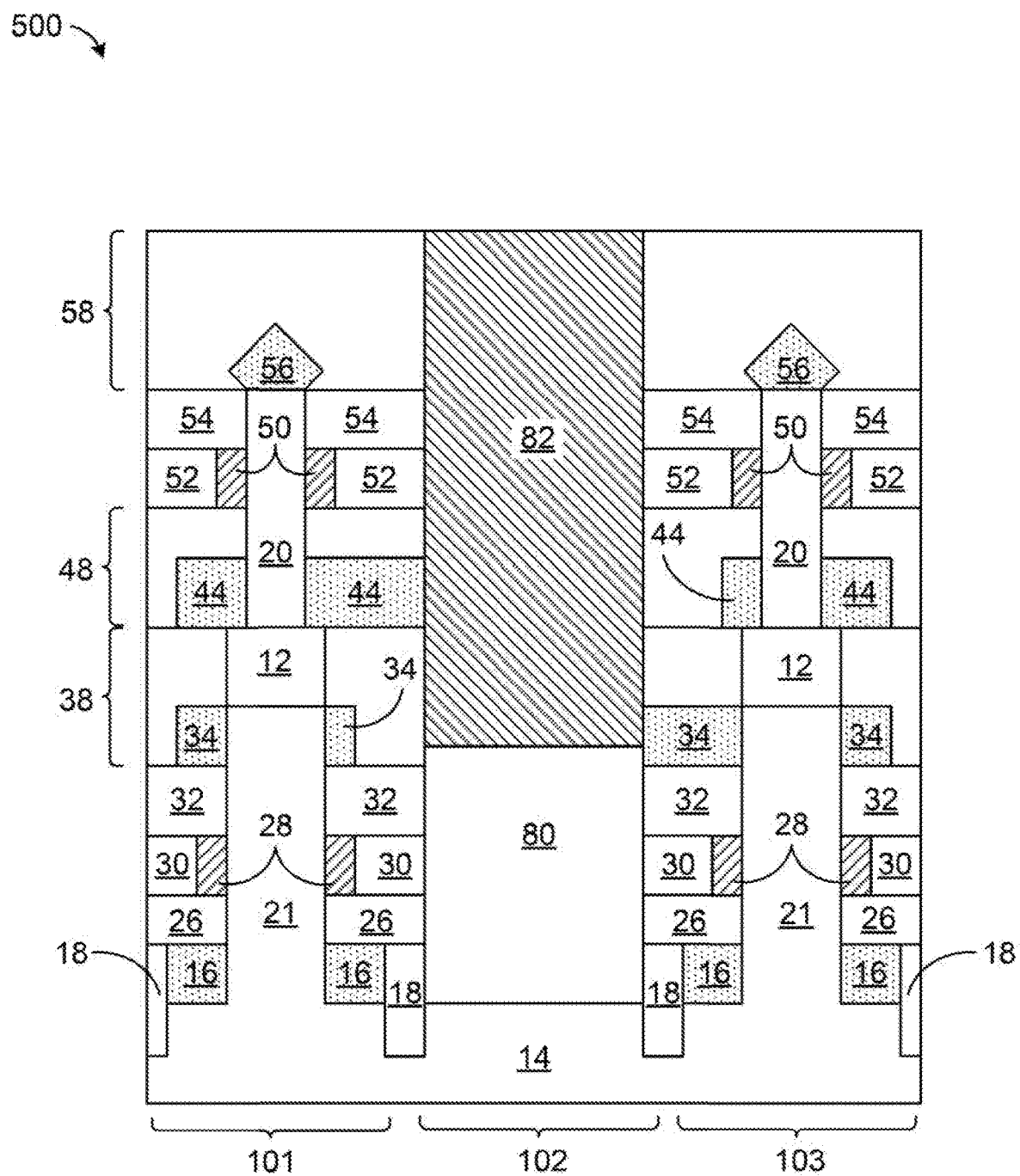
FIG. 20 illustrates a cross-sectional view of a semiconductor structure and illustrates forming a contact, according to an exemplary embodiment.

Referring to FIG. 20, formation of a contact to both the epitaxy 44 of the fin stack region 101 and the epitaxy 34 of the fin stack region 103 of a structure 500 is shown, according to an exemplary embodiment. The embodiment may include forming a sixth opening, not shown, and a dielectric 80 may fill part of the sixth opening and a contact 82 may be formed in a remainder of the sixth opening. The structure 500 is identical to the structure 100, except as specified.

The sixth opening which may be formed as described for the opening 36. The sixth opening may be formed by removal of the fin stack region 102, which includes a portion of the ILD 58, the epitaxy 56, the gate stack 50, a portion of the spacer 54, a portion of the ILD 52, the upper fin 20, the epitaxy 44, the oxide layer 12, a portion of the dielectric 38, a portion of the lower fin 21, a portion of the epitaxy 34, a portion of the spacer 32, a portion of the ILD 30, the gate stack 28, a portion of the spacer 26, and the epitaxy 16, of the fin stack region 102.

The dielectric 80 may be formed in the sixth opening, partially filling the sixth opening. The dielectric 80 may be formed as described for the dielectric 38. The dielectric 80 may be bordered on the bottom by the silicon layer 14. The dielectric 80 may be bordered on a vertical edge by the STI 18, the spacer 26, the ILD 30, the spacer 32, the dielectric 38, and a portion of the dielectric 34.

The contact 82 may be formed in a remaining portion of the second opening as described for the contact 60. The contact 82 may be bordered on the bottom by the dielectric 80. The contact 82 may be bordered on a vertical edge by a portion of the epitaxy 34, the dielectric 38, the dielectric 44, the spacer 48, the ILD 52, the spacer 54 and the ILD 58. The contact 82 may have a top which is substantially flush with the top of ILD 58.

The contact 82 may provide an electrical contact to both the epitaxy 34 of the fin stack region 103, and the epitaxy 44 of the fin stack region 101, connecting the top source/drain of the lower FET of the fin stack region 103 and the lower source drain of the upper FET of the fin stack region 101.

Comparing the structure 500 with the structure 100, comparisons are made between the epitaxy 16, the epitaxy 34, and the epitaxy 44.

The structure 100 has the epitaxy 16 connected between the fin stack regions 101, 102, and isolated between the fin stack regions 102, 103. The epitaxy 34 is isolated between the fin stack regions 101, 102, and connected between the fin stack regions 102, 103. The epitaxy 44 is connected between the fin stack regions 101, 102 and is isolated between the fin stack regions 102, 103.

The structure 500 has the epitaxy 16 isolated both between the fin stack regions 101, 102, and the fin stack regions 102, 103. The epitaxy 34 is isolated between the fin stack regions 101,102 and is connected between the fin stack regions 102, 103. The epitaxy 44 is connected between the fin stack regions 101, 102 and isolated between the fin stack regions 102,103.

Figure 21:
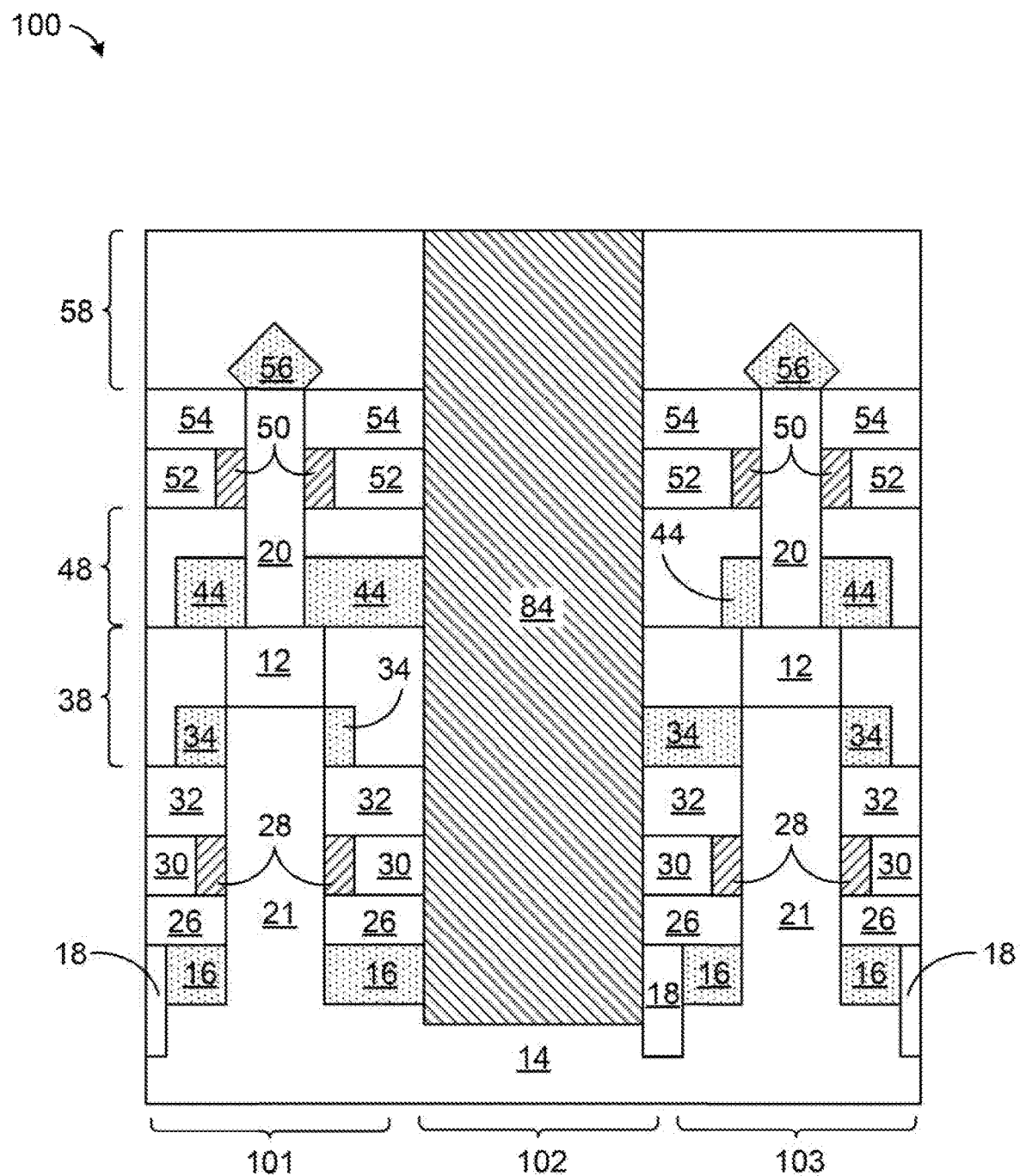
FIG. 21 illustrates a cross-sectional view of the semiconductor structure and illustrates forming a contact, according to an exemplary embodiment.

Referring to FIG. 21, returning to the structure 100, formation of a contact 84 which connects the epitaxy 44 of the fin stack region 101, the epitaxy 34 of the fin stack region 103 and the epitaxy 16 of the fin stack region 101 is shown, according to an exemplary embodiment. The embodiment may include forming a seventh opening, not shown, and forming the contact 84 in the seventh opening.

The seventh opening which may be formed as described for the opening 36. The seventh opening may be formed by removal of the fin stack region 102, which includes a portion of the ILD 58, the epitaxy 56, the gate stack 50, a portion of the spacer 54, a portion of the ILD 52, the upper fin 20, the epitaxy 44, the oxide layer 12, a portion of the dielectric 38, a portion of the lower fin 21, a portion of the epitaxy 34, a portion of the spacer 32, a portion of the ILD 30, the gate stack 28, a portion of the spacer 26, the epitaxy 16, and a portion of the silicon layer 14, of the fin stack region 102. The contact 84 may formed as described for the contact 60. The contact 84 may be bordered on the bottom by the silicon layer 14. The contact 84 may be bordered on a vertical edge by a portion of the epitaxy 16, the spacer 26, the ILD 30, the spacer 32, the dielectric 38, the spacer 48, the ILD 52, the spacer 54 and the ILD 58. The contact 76 may have a top which is substantially flush with the top of ILD 58.

The contact 84 may provide an electrical contact to the epitaxy 16 of the fin stack region 101, the epitaxy 34 of the fin stack region 103, and the epitaxy 44 of the fin stack region 101, connecting the lower source drain of the lower FET of the fin stack region 101, the top source drain of the lower FET of the fin stack region 103 and the lower source drain of the upper FET of the fin stack region 101.

As described, electrical contact to a source and to a drain of each of a lower FET and an upper NFET of a double stacked vertical FET is required. The contact to a lower source/drain region of a lower FET, to an upper source/drain region of the lower FET, to a lower source/drain region of an upper FET, or to an upper source/drain region of an upper FET, may be made by managing merged epitaxy and unmerged epitaxy of selected source/drain regions between fin stacks regions of each of the double vertical stacked FETs, and selectively removing a fin stack to form a contact in the removed region. Contacts may also be made between fin stacks to connect selected source/drain regions which are merged.

A fin stack region may be removed, where the resulting opening may extend any distance, removing one or more portions of the fin stack. A size of the opening An opening may be formed in a fin stack region, removing a portion of the fin stack region, or the entire fin stack region. A depth of the opening may be any depth such that a desired contact can be formed to a selected epitaxy to form a contact for a selected source drain of either the upper FET or the lower FET of an adjacent fin stack region.

A contact may be formed in the opening, or a combination of a dielectric and a contact may be formed in the opening. This may be determination by a design consideration for the double stack FET for which one or more source drain regions are needed for a contact to be formed. The contact may connect more than one source drain region. The contact may be formed in a portion of a fin stack region along a length of a fin.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
   a first lower fin of a first stacked fin separated by a first oxide layer from a first upper fin of the first stacked fin, both in a first region on a semiconductor substrate, wherein the first lower fin and the first upper fin of the first stacked fin are vertically aligned;
   a second lower fin of a second stacked fin separated by a second oxide layer from a second upper fin of the second stacked fin, both in a second region on the semiconductor substrate, wherein the second lower fin and the second upper fin of the second stacked fin are vertically aligned;
   a third fin located between the first fin and the second fin, wherein a height of the third fin is equal to or less than a combined height of the first lower fin, the first oxide layer and the first upper fin;

a first source drain region between the third fin and the second lower fin of the second fin, wherein the first source drain electrically connects the third fin and the second lower fin;

a second source drain region between the third lower fin and the second lower fin, electrically connecting the third lower fin and the second lower fin; and a contact electrically connected to the first source drain region and aligned directly above the third fin.

2. The semiconductor structure according to claim 1, further comprising:

a first spacer layer directly above the first source drain region;

a lower gate stack directly above the first spacer layer;

a second spacer layer directly above the lower gate stack;

a first lower fin second source drain region;

a dielectric layer directly above the second spacer layer, wherein a vertical side surface of the contact is coplanar with a vertical side surface of the first spacer layer, a vertical side surface of the second spacer layer, and a vertical side surface of the dielectric layer.

3. The semiconductor structure according to claim 2, further comprising:

a third source drain directly above the dielectric layer and directly adjacent to the first upper fin;

a third spacer layer directly above the third source drain region and directly adjacent to the first upper fin;

an upper gate stack directly above the third spacer layer and directly adjacent to the first upper fin;

a fourth spacer layer directly above the upper gate stack and directly adjacent to the first upper fin; and a fourth source drain directly above the first upper fin.

4. The semiconductor structure according to claim 2, further comprising:

a first spacer of the second lower fin directly above the first source drain region; and a lower gate stack of the second lower fin directly above the first spacer layer of the second lower fin.

5. The semiconductor structure according to claim 1, wherein there is no third upper fin of the third fin.

6. The semiconductor structure according to claim 1, wherein the first lower fin of the first stacked fin is part of a negative channel vertical field effect transistor and the first upper fin of the first stacked fin is part of a positive channel vertical field effect transistor.

7. A semiconductor structure comprising:

a first lower fin of a first stacked fin separated by a first oxide layer from a first upper fin of the first stacked fin, both in a first region on a semiconductor substrate, wherein the first lower fin and the first upper fin are vertically aligned;

a second lower fin of a second stacked fin separated by a second oxide layer from a second upper fin of the second stacked fin, both on the semiconductor substrate in a second region on the semiconductor substrate, wherein the second lower fin and the second upper fin of the second stacked fin are vertically aligned;

a third lower fin of a third stacked fin separated by a third oxide layer from a third upper fin of the third stacked fin, both on the semiconductor substrate in a second region, wherein the third lower fin and the third upper fin of the third stacked fin are vertically aligned and are located between the first stacked fin and the second stacked fin;

an upper fin lower source drain region between the first upper fin and the third upper fin;

an upper fin upper source drain region above the first upper fin; and a contact electrically connected to the upper fin lower source drain region and aligned directly above the third lower fin of the third stacked fin.

8. The semiconductor structure according to claim 7, further comprising:

a first source drain region surrounding the first lower fin and a first source drain region of the second lower fin surrounding the second lower fin;

a shallow trench isolation region separating the first source drain region of the first lower fin and the first source drain region of the second lower fin;

a first spacer layer directly above the shallow trench isolation region and directly above the first source drain region of the first lower fin and directly above the first source drain region of the second lower fin;

a lower gate stack directly above the first spacer layer surrounding the first lower fin and a lower gate stack of the second lower fin directly above the first spacer layer of the second lower fin;

a second spacer layer directly above the lower gate stack and between the first lower fin and the second lower fin;

a first lower fin second source drain region directly above the second spacer layer and electrically connecting the first lower fin and the second lower fin;

a dielectric layer directly above the second spacer layer and between the first lower fin second source drain region and the second lower fin second source drain region, wherein a vertical side surface of the contact is coplanar with a vertical side surface of the dielectric layer.

9. The semiconductor structure according to claim 8, further comprising:

a third source drain directly above the dielectric layer and directly adjacent to the first upper fin;

a third spacer layer directly above the third source drain region and directly adjacent to the first upper fin;

an upper gate stack directly above the third spacer layer and directly adjacent to the first upper fin;

a fourth spacer layer directly above the upper gate stack and directly adjacent to the first upper fin; and a fourth source drain directly above the first upper fin.

10. The semiconductor structure according to claim 8, further comprising:

a second contact, wherein a horizontal lower surface of the second contact is coplanar with a horizontal upper surface of the third source drain.

11. The semiconductor structure according to claim 8, wherein a lower horizontal surface of the contact is coplanar with an upper horizontal surface of the second lower fin.

12. The semiconductor structure according to claim 7, further comprising:

a third lower fin of a third stacked fin in a third region on the semiconductor substrate.

13. The semiconductor structure according to claim 7, wherein the first lower fin of the first fin stack is part of a negative channel field effect transistor and the first upper fin of the first fin stack is part of a positive channel field effect transistor.

14. The semiconductor structure according to claim 7, wherein there is no upper fin upper source drain region of the third upper fin.

15. A semiconductor structure comprising:
- an array of stacked fins evenly spaced on a semiconductor substrate;
- a first lower fin of a first stacked fin of the array of fins separated by an oxide layer from a first upper fin of the first stacked fin, both in a first region on semiconductor substrate, wherein the first lower fin and the first upper fin are vertically aligned;
- a second lower fin of a second stacked fin of the array of fins below a second oxide layer of a second stacked fin, in a second region on the semiconductor substrate, both in a second region on the semiconductor substrate;
- a first source drain region surrounding the first lower fin and a first source drain region of the second lower fin surrounding the second lower fin;
- a contact electrically connected to the first source drain region of the first upper fin between the first stacked fin and the second stacked fin, wherein the contact replaces a fin position in the array of stacked fins and is evenly spaced with fins of the array of stacked fins.

16. The semiconductor structure according to claim 15, further comprising:
- a shallow trench isolation region separating the first source drain region of the first lower fin and the first source drain region of the second lower fin;
- a first spacer layer directly above the shallow trench isolation region and directly above the first source drain region of the first lower fin and directly above the first source drain region of the second lower fin;
- a lower gate stack directly above the first spacer layer and between surrounding the first lower fin and a lower gate stack of the second lower fin directly above the first spacer layer of the second lower fin;
- a second spacer layer directly above the lower gate stack and between the first lower fin and the second lower fin;
- a first lower fin second source drain region directly above the second spacer layer and surrounding the first lower fin;
- a first lower fin second source drain region directly above the second spacer layer and surrounding the second lower fin;
- a dielectric layer directly above the second spacer layer and between the first lower fin second source drain region and the second lower fin second source drain region, electrically isolating the first lower fin second source drain region and the second lower fin second source drain region;
- a first source drain region of the first upper fin surrounding both the first upper fin and the second upper fin; and
- an upper dielectric layer above the first source drain region of the first upper fin.

17. The semiconductor structure according to claim 15, wherein
the contact comprises a vertical side surface coplanar to a vertical side surface of the upper dielectric layer.

18. The semiconductor structure according to claim 15, further comprising:
a third lower fin of a third stacked fin in a third region on the semiconductor substrate.

19. The semiconductor structure according to claim 15, further comprising:
a fourth source drain directly above the first upper fin.

* * * * *